US012693565B2

(12) United States Patent
Asai

(10) Patent No.: US 12,693,565 B2
(45) Date of Patent: Jul. 28, 2026

(54) LIQUID CRYSTAL DISPLAY DEVICE

(71) Applicant: Shanghai Tianma Micro-Electronics Co., Ltd., Shanghai (CN)

(72) Inventor: Takuya Asai, Kawasaki (JP)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 416 days.

(21) Appl. No.: 18/312,318

(22) Filed: May 4, 2023

(65) Prior Publication Data

US 2023/0359092 A1 Nov. 9, 2023

(30) Foreign Application Priority Data

May 6, 2022 (JP) .................................. 2022-076441
Feb. 10, 2023 (JP) .................................. 2023-018925

(51) Int. Cl.
| | |
|---|---|
| *G02F 1/136* | (2006.01) |
| *G02F 1/1343* | (2006.01) |
| *G02F 1/1362* | (2006.01) |
| *G02F 1/1368* | (2006.01) |
| *H10D 86/40* | (2025.01) |
| *H10D 86/60* | (2025.01) |

(52) U.S. Cl.
CPC .... *G02F 1/13606* (2021.01); *G02F 1/134309* (2013.01); *G02F 1/136286* (2013.01); *G02F 1/1368* (2013.01); *H10D 86/441* (2025.01); *H10D 86/60* (2025.01)

(58) Field of Classification Search
CPC .......... G02F 1/13606; G02F 1/134309; H10D 86/441; H10D 86/60
See application file for complete search history.

(56) References Cited

U.S. PATENT DOCUMENTS

2015/0092127 A1 4/2015 Yonekura

FOREIGN PATENT DOCUMENTS

| | | |
|---|---|---|
| JP | 2015-72339 A | 4/2015 |
| KR | 10-1330393 A | 11/2013 |

*Primary Examiner* — Lucy P Chien
(74) *Attorney, Agent, or Firm* — Sughrue Mion, PLLC

(57) ABSTRACT

A liquid crystal display device includes a plurality of pixels including a switching element and a pixel electrode, a plurality of scanning lines connected to a gate electrode of the switching element, and a plurality of data lines connected to a source electrode of the switching element and crossing the scanning lines. The plurality of pixels includes a first pixel and a second pixel for which a relative position of the pixel electrode, relative to at least one of the data line to which the source electrode connects and the scanning line to which the gate electrode connects, differs. When viewed from above, in each of the plurality of pixels, a positional relationship of a semiconductor layer of the switching element, the gate electrode, a portion of the source electrode that overlaps the semiconductor layer, and a portion of the drain electrode that overlaps the semiconductor layer is identical, and an external shape of the pixel electrode is identical.

11 Claims, 20 Drawing Sheets

LIQUID CRYSTAL DISPLAY DEVICE

CROSS-REFERENCE TO RELATED APPLICATIONS

This application claims the benefit of Japanese Patent Application No. 2022-076441, filed on May 6, 2022, and Japanese Patent Application No. 2023-018925, filed on Feb. 10, 2023, of which the entirety of the disclosures is incorporated by reference herein.

FIELD OF THE INVENTION

The present disclosure relates generally to a liquid crystal display device.

BACKGROUND OF THE INVENTION

Double scanning line system (also called dual gate structure) liquid crystal display devices are known as liquid crystal display devices in which manufacturing costs are suppressed by reducing the number of driver integrated circuit (IC) chips.

For example, Unexamined Japanese Patent Application Publication No. 2015-72339 describes a liquid crystal display device including a plurality of pixel electrodes arranged in a row direction and a column direction; with respect to one row of the pixel electrodes, a first gate wiring disposed along the row direction on one side in the column direction, a second gate wiring disposed along the row direction on the other side in the column direction, and a plurality of source wirings disposed along the column direction between the pixel electrodes; a first pixel switch; and a second pixel switch. The first pixel switch is provided between the source wiring and one of two pixel electrodes that are adjacent in the row direction, of the pixel electrodes. The first pixel switch is turned ON/OFF by a gate signal supplied from the first gate wiring. The second pixel switch is connected between the source wiring and the other of the two pixel electrodes. The second pixel switch is turned ON/OFF by a gate signal supplied from the second gate wiring.

In Unexamined Japanese Patent Application Publication No. 2015-72339, the first pixel switch is positioned on the +Y side of the pixel electrode connected to the first pixel switch. Additionally, in the first pixel switch, a semiconductor layer is stacked on a gate electrode. Moreover, a source electrode connected to the source wiring surrounds, in a U-shape from the +Y side, a drain electrode connected to the pixel electrodes on the semiconductor layer. The drain electrode is positioned on the –Y side on the semiconductor layer and extends in the –Y direction.

Meanwhile, the second pixel switch is positioned on the –Y side of a pixel electrode connected to the second pixel switch. In the second pixel switch, a semiconductor layer is stacked on a gate electrode. A source electrode surrounds, in a U-shape from the –Y side, a drain electrode on the semiconductor layer. The drain electrode is positioned on the +Y side on the semiconductor layer and extends in the +Y direction.

In the first pixel switch and the second pixel switch, the positional relationship between the source electrode and the drain electrode differs and, as such, when a positional shift occurs in a case in which the source electrodes and the drain electrodes are formed on the semiconductor layers, a difference occurs in the characteristics of the first pixel switch and the second pixel switch, and display inconsistencies of the liquid crystal display device may occur. For example, in a case in which the source electrodes and the drain electrodes are formed on semiconductor layers, when the positions of the source electrodes and the drain electrodes shift in the +Y direction with respect to the semiconductor layers, the overlapping of the source electrode and the semiconductor layer decreases and the overlapping of the drain electrode and the semiconductor layer increases in the first pixel switch. Meanwhile, when the positions of the source electrodes and the drain electrodes shift in the +Y direction with respect to the semiconductor layers, the overlapping of the source electrode and the semiconductor layer increases and the overlapping of the drain electrode and the semiconductor layer decreases in the second pixel switch. Due to this, a difference occurs in the characteristics of the first pixel switch and the second pixel switch and, as such, inconsistencies in the display of the liquid crystal display device may occur.

Furthermore, in Unexamined Japanese Patent Application Publication No. 2015-72339, when viewing the liquid crystal display device from above, the shape of the pixel electrode connected to the first pixel switch and the shape of the pixel electrode connected to the second pixel switch are different. Due to this, the parasitic capacitance generated between the source wiring and the pixel electrode connected to the first pixel switch and the parasitic capacitance generated between the source wiring and the pixel electrode connected to the second pixel switch may differ.

SUMMARY OF THE INVENTION

A liquid crystal display device of the present disclosure includes:

a plurality of pixels that include a switching element and a pixel electrode connected to a drain electrode of the switching element, the plurality of pixels being is disposed in a matrix;

a plurality of scanning lines connected to a gate electrode of the switching element; and a plurality of data lines connected to a source electrode of the switching element and crossing the scanning lines, wherein the plurality of pixels includes a first pixel and a second pixel for which a relative position of the pixel electrode, relative to at least one of the data line to which the source electrode connects and the scanning line to which the gate electrode connects, differs, when viewed from above, a positional relationship, in each of the plurality of pixels, of a semiconductor layer of the switching element, the gate electrode, a portion of the source electrode that overlaps the semiconductor layer, and a portion of the drain electrode that overlaps the semiconductor layer is identical, and when viewed from above, an external shape of the pixel electrode in each pixel of the plurality of pixels is identical.

It is to be understood that both the foregoing general description and the following detailed description are exemplary and explanatory and are not restrictive of this disclosure.

BRIEF DESCRIPTION OF DRAWINGS

A more complete understanding of this application can be obtained when the following detailed description is considered in conjunction with the following drawings, in which:

FIG. 1 is a block diagram illustrating the configuration of a liquid crystal display device according to Embodiment 1;

FIG. 2 is a plan view illustrating a liquid crystal display panel according to Embodiment 1;

FIG. 8 is a schematic drawing illustrating connection relationships between pixel electrodes, switching elements, scanning lines, and data lines according to Embodiment 3;

FIG. 27 is a schematic drawing illustrating the switching element of the second pixel according to a modified example;

FIG. 28 is a schematic drawing illustrating connection relationships between a pixel electrode, a switching element, a scanning line, and a data line in a second pixel according to a modified example;

FIG. 29 is a schematic drawing illustrating the switching element of the second pixel according to a modified example;

DETAILED DESCRIPTION OF THE INVENTION

Figure 3:
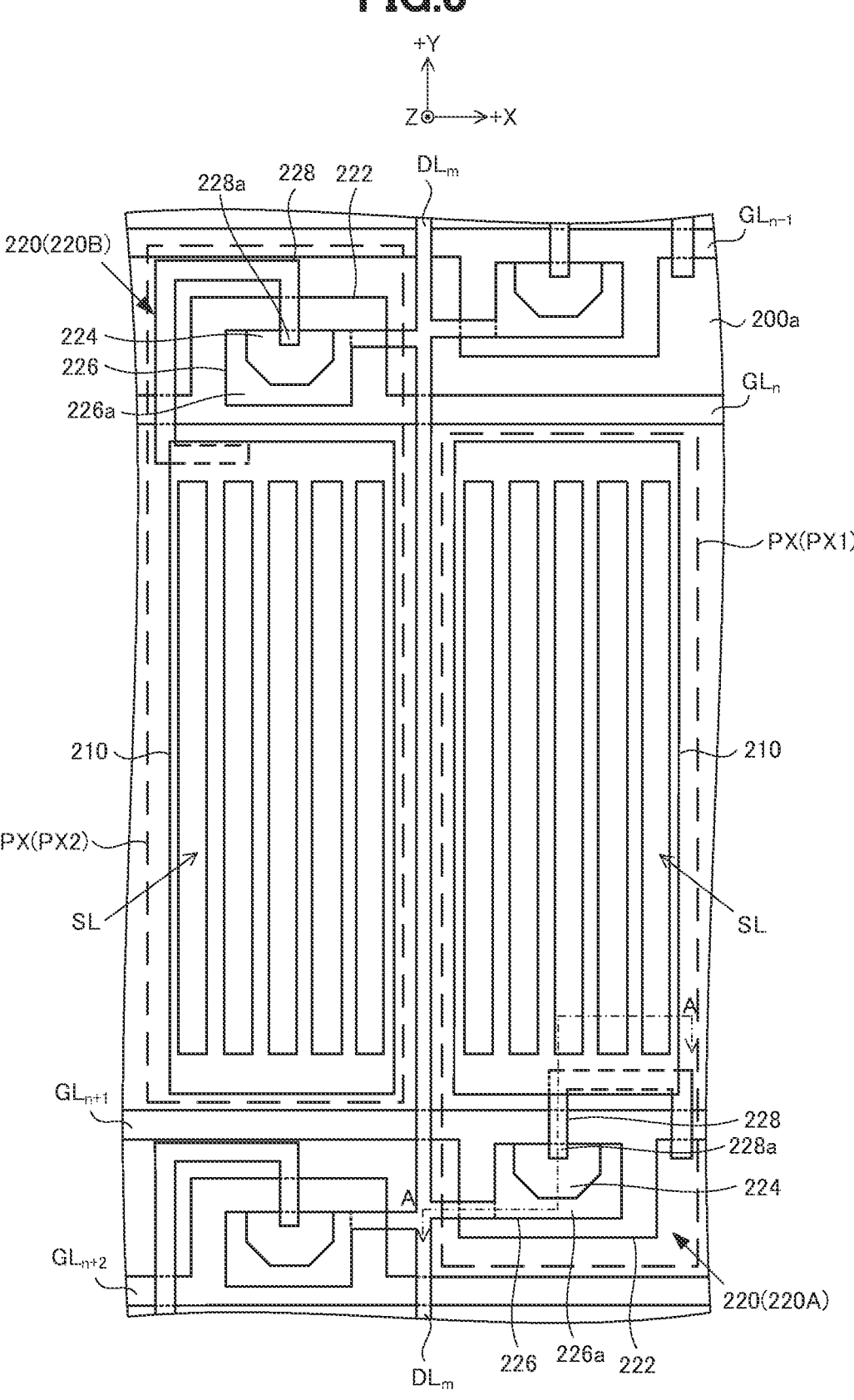
FIG. 3 is a plan view illustrating the configuration of the liquid crystal display panel according to Embodiment 1.

Hereinafter, a liquid crystal display device according to various embodiments is described while referencing the drawings.

Embodiment 1

Figures 1, 2:
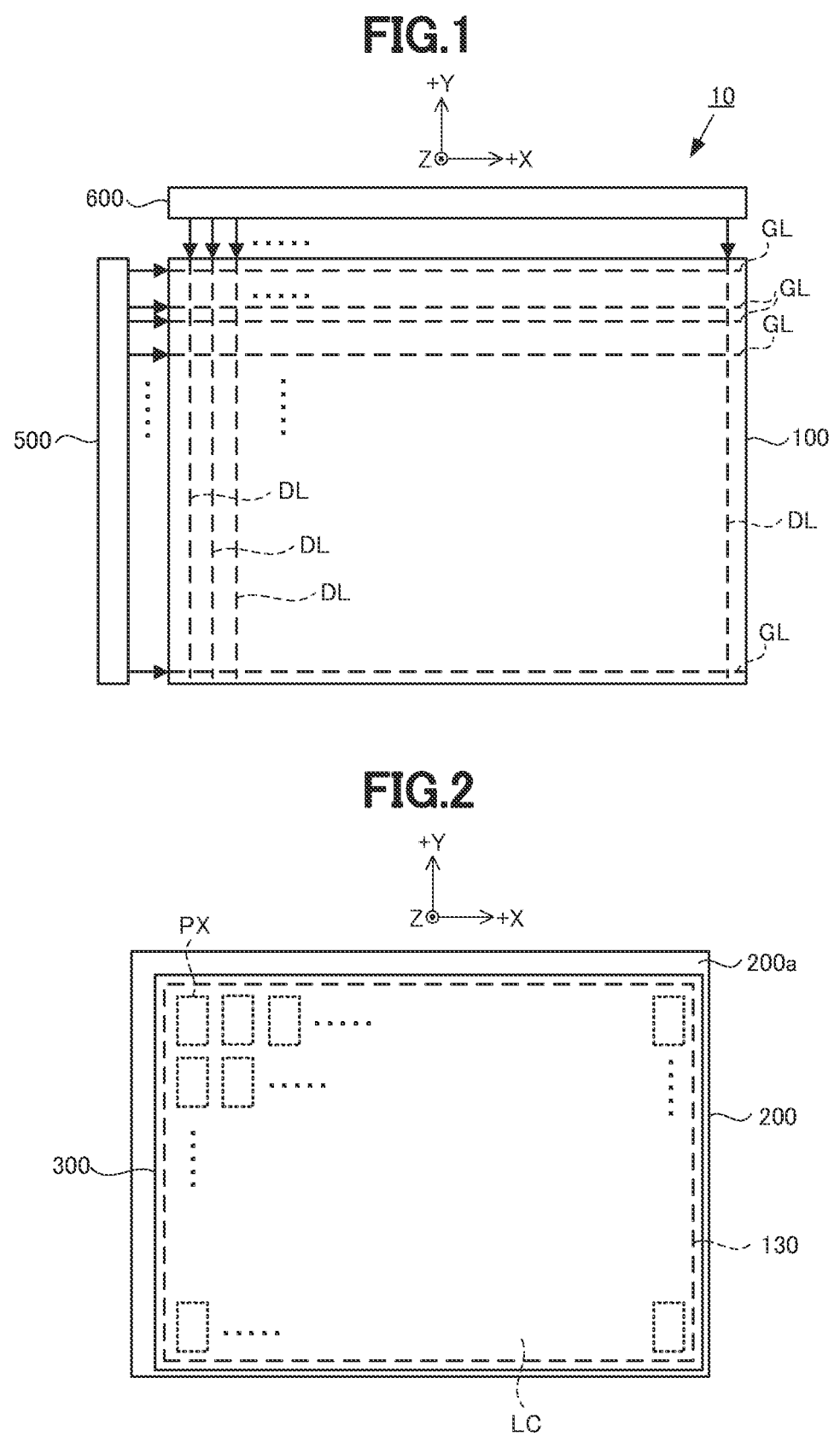

A liquid crystal display device 10 according to the present embodiment is described while referencing FIGS. 1 to 5. As illustrated in FIG. 1, the liquid crystal display device 10 includes a liquid crystal display panel 100, a gate driver 500, and a data driver 600. Additionally, the liquid crystal display device 10 includes a timing controller, a common voltage controller, a back light, and the like, all not illustrated in the FIG. 1. In the present description, to facilitate comprehension, in the liquid crystal display device 10 of FIG. 1, the right direction (the right direction on paper) is referred to as the "+X direction", the up direction (the up direction on paper) is referred to as the "+Y direction", and the direction perpendicular to the +X direction and the +Y direction (the front direction on paper) is referred to as the "+Z direction."

Additionally, in the present description, it is assumed that an observer is positioned on the +Z side of the liquid crystal display device 10.

As illustrated in FIG. 2, the liquid crystal display panel 100 of the liquid crystal display device 10 includes a thin film transistor (TFT) substrate 200, a counter substrate 300, and a liquid crystal LC. Additionally, the liquid crystal display panel 100 includes a first polarizing plate 110 and a second polarizing plate 120 that are described later. The liquid crystal display panel 100 includes a plurality of pixels PX arranged in a matrix. Note that the first polarizing plate 110 and the second polarizing plate 120 are omitted from FIG. 2 to facilitate comprehension.

A plurality of scanning lines GL (GL$_n$, where n is an integer of 1 or greater), a plurality of data lines DL (DL$_m$, where m is an integer of 1 or greater), pixel electrodes 210, switching elements 220, and common electrodes CE of the pixels PX, and the like, all described later, are formed on the TFT substrate 200. Additionally, a color filter CF, a black matrix BM, and the like, all described later, are formed on the counter substrate 300. As illustrated in FIG. 2, the TFT substrate 200 and the counter substrate 300 are affixed to each other by a seal material 130. The TFT substrate 200 and the counter substrate 300 sandwich the liquid crystal LC. A detailed configuration of the liquid crystal display panel 100 is described later. The scanning lines GL and the data lines DL may be referred to collectively as wirings.

Returning to FIG. 1, the gate driver 500 of the liquid crystal display device 10 sequentially supplies a scanning signal to the scanning lines GL of the liquid crystal display panel 100, and sequentially drives the pixels PX that include the switching elements 220 that are connected to the scanning lines GL. The data driver 600 of the liquid crystal display device 10 supplies an image signal (gradation voltage) to each of the data lines DL of the liquid crystal display panel 100.

The timing controller of the liquid crystal display device 10 generates a control signal for synchronizing the operations of the gate driver 500, the data driver 600, and the like, and supplies the control signal to the gate driver 500, the data driver 600, and the like. The common voltage controller of the liquid crystal display device 10 controls the potential of the common electrodes CE. The back light of the liquid crystal display device 10 is disposed on a side (the −Z side), opposite the display surface, of the liquid crystal display panel 100, and supplies light to the liquid crystal display panel 100.

Figures 4, 5:
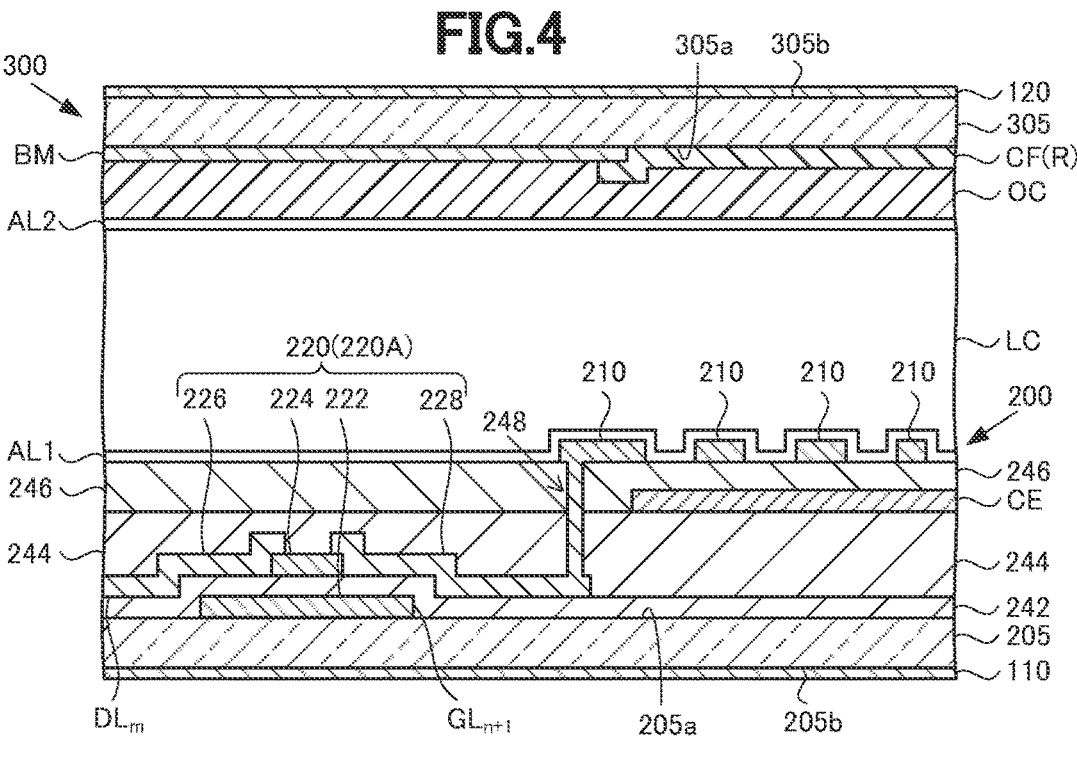
FIG. 4 is a cross-sectional view of the liquid crystal display panel illustrated in FIG. 3, taken along line A-A.
FIG. 5 is a schematic drawing illustrating connection relationships between pixel electrodes, switching elements, scanning lines, and data lines according to Embodiment 1.

Next, the configuration of the liquid crystal display panel 100 is described while referencing FIGS. 3 to 5. FIG. 3 is a plan view illustrating the configuration of the liquid crystal display panel 100, and FIG. 4 is a cross-sectional view of the liquid crystal display panel 100 illustrated in FIG. 3, taken along line A-A. FIG. 5 is a schematic drawing illustrating connection relationships between the pixel electrodes 210, the switching elements 220, the scanning lines GL, and the data lines DL. Note that, the common electrodes CE, a hereinafter described first insulating layer 242 of the TFT substrate 200, the counter substrate 300, and the like are omitted from FIG. 3 to facilitate comprehension. Additionally, in some of the following drawings as well, the common electrodes CE, the first insulating layer 242, the counter substrate 300, and the like are omitted.

In the present embodiment, the liquid crystal display panel 100 is a double scanning line liquid crystal display panel in which one data line DL is shared by two adjacent pixels PX, and the number of the scanning lines GL is doubled. Additionally, the liquid crystal display panel 100 is a transmissive panel and operates in a fringe field switching (FFS) mode.

The TFT substrate 200 of the liquid crystal display panel 100 includes a first light-transmitting substrate 205, the plurality of scanning lines GL, the plurality of data lines DL, the pixel electrodes 210 of the pixels PX, and the like. In one example, the first light-transmitting substrate 205 is implemented as a glass substrate. As illustrated in FIGS. 3 to 5, the plurality of scanning lines GL, the plurality of data lines DL, and the pixel electrodes 210, the switching elements 220, the common electrodes CE, and the like of the pixels PX are formed on a first main surface 205a of the first light-transmitting substrate 205. The first polarizing plate 110 is provided on a second main surface 205b of the first light-transmitting substrate 205. The second main surface 205b is on a side opposite the first main surface 205a of the first light-transmitting substrate 205.

Firstly, the connection relationships of the pixel electrodes 210, the switching elements 220, the scanning lines GL, and the like are described. In the present embodiment, as illustrated in FIG. 5, the pixel electrodes 210 of the pixels PX are arranged in a matrix in the X direction and the Y direction. The scanning lines GL extend in the X direction. Additionally, the scanning lines GL are provided two at a time sandwiching, from each side, namely the +Y side and the −Y side, a row of the pixel electrodes 210 arranged in the X direction. The data lines DL extend in Y direction. The data lines DL are provided one at a time dividing every two rows of the pixel electrodes 210 arranged in the Y direction.

As illustrated in FIG. 3, each of the switching elements 220 connected to each of the pixel electrodes 210 is disposed between the scanning lines GL that are disposed two at a time (for example, between the scanning line GL$_n$−1 and the scanning line GL$_n$). As illustrated in FIGS. 3 to 5, the source electrodes of the switching elements 220, connected to the pixel electrodes 210 that are adjacent to each other and that sandwich a data line DL (for example, data line DL$_m$), are connected to the same data line DL that the pixel electrodes 210 sandwich. Meanwhile, of the pixel electrodes 210 that are adjacent to each other and that sandwich a data line DL (for example, the data line DL$_m$), the gate electrode of the switching element 220 connected to the pixel electrode 210 positioned on the +X side is connected to the adjacent scanning line GL (for example the scanning line GL$_n$+1) positioned on the −Y side. Of the pixel electrodes 210 that are adjacent to each other and that sandwich a data line DL (for example, the data line DL$_m$), the gate electrode of the switching element 220 connected to the pixel electrode 210 positioned on the −X side is connected to the adjacent scanning line GL (for example, the scanning line GL$_n$) positioned on the +Y side.

Accordingly, in the present embodiment, the pixels PX include a first pixel PX1 and a second pixel PX2 in which the relative position of the pixel electrode 210 with respect to at least one of the data line DL, to which the source electrode of the switching element 220 connects, and the scanning line GL, to which the gate electrode of the switching element 220 connects, differs. Specifically, as illustrated in FIG. 5, in the first pixel PX1, the pixel electrode 210 is positioned on the +X side with respect to the data line DL to which the source electrode connects, and is positioned on the +Y side with respect to the scanning line GL to which the gate electrode connects. In the second pixel PX2, the pixel electrode 210 is positioned on the −X side with respect to the data line DL to which the source electrode connects, and is positioned on the −Y side with respect to the scanning line GL to which the gate electrode connects. In the following, the first pixel PX1 and the second pixel PX2 are sometimes referred to collectively as pixels PX. Additionally, the switching element 220 of the first pixel PX1 is sometimes referred to as switching element 220A, the switching element 220 of the second pixel PX2 is sometimes referred to as switching element 220B, and the switching element 220A and the switching element 220B are sometimes referred to collectively as switching elements 220.

Returning to FIGS. 3 and 4, the specific configurations of the scanning lines GL, the common electrodes CE, the pixel electrodes 210, the switching elements 220, and the like are described.

The scanning lines GL extend in the X direction, and are formed on the first main surface 205a of the first light-transmitting substrate 205. The scanning lines GL are formed from a metal such as aluminum (Al), molybdenum (Mo), or the like. The scanning lines GL are covered by the first insulating layer 242.

The data lines DL extend in the Y direction and are formed on the first insulating layer 242. The data lines DL also are formed from a metal such as aluminum (Al), molybdenum (Mo), or the like. The data lines DL are covered by a second insulating layer 244.

The common electrodes CE are connected to the common voltage controller via a non-illustrated common wiring. The common electrodes CE are formed, from indium tin oxide (ITO), on the first insulating layer 242 and the second insulating layer 244. The common electrodes CE are covered by a third insulating layer 246.

The pixel electrode 210 of the first pixel PX1 is sandwiched between the scanning lines GL (the scanning line $GL_n$ and the scanning line $GL_n+1$), and is provided on the +X side of the connecting data line DL ($DL_m$). The pixel electrode 210 of the second pixel PX2 is sandwiched between the scanning lines GL (the scanning line GL, and the scanning line $GL_n+1$), and is provided on the −X side of the connecting data line DL ($DL_m$). The pixel electrodes 210 of the first pixel PX1 and the second pixel PX2 are respectively connected to the drain electrode 228 of the switching element 220 via a contact hole 248 provided in the second insulating layer 244 and the third insulating layer 246. The pixel electrodes 210 are formed from ITO.

The pixel electrodes 210 of the first pixel PX1 and the second pixel PX2 include a slit SL extending in the Y direction. The pixel electrodes 210 of the first pixel PX1 and the second pixel PX2 have the same external shape (rectangular shape) when viewed from the observer. Due to this, in the liquid crystal display panel 100, the parasitic capacitance that is generated between the pixel electrode 210 of the first pixel PX1 and the data lines DL and the parasitic capacitance that is generated between the pixel electrode 210 of the second pixel PX2 and the data lines DL can be made equivalent to each other.

In one example, the switching elements 220 of the pixels PX are implemented as TFT elements. The switching elements 220 each include a gate electrode 222, a semiconductor layer 224, a source electrode 226, and a drain electrode 228. In the present embodiment, the gate electrode 222 is formed integrally with the scanning lines GL on the first main surface 205a of the TFT substrate 200. As with the scanning lines GL, the gate electrode 222 is covered by the first insulating layer 242.

The semiconductor layer 224 is provided, via the first insulating layer 242, in an island manner on the gate electrode 222. In one example, the semiconductor layer 224 is formed from amorphous silicon. The source electrode 226 is formed, branching from the data line DL, on the first insulating layer 242 and the semiconductor layer 224. The source electrode 226 has a U-shape on the semiconductor layer 224, and surrounds the drain electrode 228 on the semiconductor layer 224. The drain electrode 228 is provided on the first insulating layer 242 and the semiconductor layer 224, and is connected to the pixel electrode 210 via the contact hole 248. As with the data lines DL, the source electrode 226 and the drain electrode 228 are formed from a metal such as aluminum (Al), molybdenum (Mo), or the like. Additionally, the semiconductor layer 224, the source electrode 226, and the drain electrode 228 are covered by the second insulating layer 244 and the third insulating layer 246.

Next, the positional relationships, when viewing the liquid crystal display panel 100 from the observer side (the +Z side), of the gate electrode 222, the semiconductor layer 224, the source electrode 226, and the drain electrode 228 are described.

As illustrated in FIG. 3, in the switching element 220A of the first pixel PX1, the semiconductor layer 224 is positioned on the gate electrode 222, and the source electrode 226 is positioned on the −Y side on the semiconductor layer 224 and surrounds the drain electrode 228 from the −Y side. The drain electrode 228 of the switching element 220A is positioned on the +Y side on the semiconductor layer 224, and extends in the +Y direction to connect to the pixel electrode 210 positioned on the side (the +Y side) where the drain electrode 228 and the semiconductor layer 224 overlap.

With the switching element 220B of the second pixel PX2 as well, the semiconductor layer 224 is positioned on the gate electrode 222. Additionally, the source electrode 226 of the switching element 220B is positioned on the −Y side on the semiconductor layer 224, and surrounds the drain electrode 228 from the −Y side. The drain electrode 228 of the switching element 220B is positioned on the +Y side on the semiconductor layer 224. The drain electrode 228 of the switching element 220B extends in the +Y direction and then bends to connect to the pixel electrode 210 positioned on the side (the −Y side) opposite the side where the drain electrode 228 and the semiconductor layer 224 overlap.

That is, as illustrated in FIG. 3, in the switching element 220A of the first pixel PX1 and the switching element 220B of the second pixel PX2, the positional relationships of the gate electrode 222, the semiconductor layer 224, a portion 226a of the source electrode 226 that overlaps the semiconductor layer 224, and a portion 228a of the drain electrode 228 that overlaps the semiconductor layer 224 are formed the same. In the present embodiment, the positional relationships of the gate electrode 222, the semiconductor layer 224, the portion 226a of the source electrode 226 that overlaps the semiconductor layer 224, and the portion 228a of the drain electrode 228 that overlaps the semiconductor layer 224 in the switching element 220A and the switching element 220B are the same and, as such, even when misalignment between the layers (positional shift of the various components) occurs when forming the gate electrode 222, the semiconductor layer 224, the source electrode 226, and the drain electrode 228, the various components of the switching element 220A and the switching element 220B shift in the same direction. Accordingly, in the present embodiment, even when misalignment between the layers occurs when forming the gate electrode 222, the semiconductor layer 224, the source electrode 226, and the drain electrode 228, differences in the characteristics of the switching element 220A and the switching element 220B can be reduced. As a result, display inconsistencies of the liquid crystal display device 10 can be suppressed.

As illustrated in FIG. 4, the first insulating layer 242 covers the scanning lines GL and the gate electrode 222 of each of the switching elements 220. The second insulating layer 244 covers the semiconductor layer 224, the source electrode 226, and the drain electrode 228 of the switching element 220, and the first insulating layer 242. The third insulating layer 246 covers the common electrode CE and the second insulating layer 244. In one example, the first insulating layer 242 to the third insulating layer 246 are formed from silicon nitride (SiNx).

An alignment film AL1, subjected to an alignment treatment, is provided on the third insulating layer 246 and the pixel electrodes 210. In one example, the alignment film AL1 is implemented as a polyimide thin film.

The counter substrate 300 of the liquid crystal display panel 100 includes a second light-transmitting substrate 305, a black matrix BM, and the like. In one example, the second light-transmitting substrate 305 is implemented as a glass substrate. As illustrated in FIG. 4, the black matrix BM, a color filter CF, an overcoat layer OC, and an alignment film AL2 are formed on a first main surface 305a of the second light-transmitting substrate 305. The first main surface 305a of the second light-transmitting substrate 305 opposes the first main surface 205a of the first light-transmitting substrate 205. The second polarizing plate 120 is provided on a second main surface 305b of the second light-transmitting substrate 305. The second main surface 305b is a side of the second light-transmitting substrate 305 opposite the first main surface 305a.

The black matrix BM defines a region that transmits the light of the pixels PX. In one example, the color filter CF is implemented as a color filter having a vertically striped arrangement in which each of three colors, namely red (R), green (G), and blue (B), is arranged in one row in the Y direction. The overcoat layer OC covers the black matrix BM and the color filter CF. In one example, the overcoat layer OC is formed from a light-transmitting resin. The alignment film AL2 is provided on the overcoat layer OC and is subjected to an alignment treatment. In one example, the alignment film AL2 is implemented as a polyimide thin film.

The liquid crystal LC of the liquid crystal display panel 100 is implemented as a nematic liquid crystal. The liquid crystal LC is homogeneously aligned by the alignment film AL1 and the alignment film AL2. The liquid crystal LC twist-deforms in-plane due to an electric field component parallel to the first main surface 205a of the TFT substrate 200 caused by the potential difference between the common electrode CE and the pixel electrodes 210, thereby controlling the amount of transmitted light of the pixels PX for every pixel PX.

The first polarizing plate 110 of the liquid crystal display panel 100 is provided on the second main surface 205b of the first light-transmitting substrate 205. The second polarizing plate 120 of the liquid crystal display panel 100 is provided on the second main surface 305b of the second light-transmitting substrate 305. In one example, the first polarizing plate 110 and the second polarizing plate 120 are disposed in a cross-Nicol arrangement (normally black mode).

Next, a manufacturing method for the liquid crystal display device 10 is described. Firstly, a manufacturing method for the TFT substrate 200 is described.

Firstly, an aluminum thin film is formed, by sputtering, on the first main surface 205a of the first light-transmitting substrate 205 and, then, the aluminum thin film is treated by etching to form the scanning lines GL and the gate electrode 222. Next, a silicon nitride thin film, an amorphous silicon (i-a-Si: intrinsic amorphous silicon) thin film, and an n-type amorphous silicon (n-a-Si: n-type intrinsic amorphous silicon) thin film are consecutively formed by plasma chemical vapor deposition (PCVD) and, then, the amorphous thin film and the n-type amorphous silicon thin film are etched while leaving, in an island manner, a portion that becomes the semiconductor layer 224. Then, an aluminum thin film is formed by sputtering and, then, the aluminum thin film is treated by etching to form the data lines DL, the source electrode 226, and the drain electrode 228. Furthermore, unnecessary n-type amorphous silicon portions are removed by etching.

Next, a silicon nitride thin film is formed as the second insulating layer 244 and, then, the common electrode CE and the common wiring are formed from ITO on the second insulating layer 244. Then, a silicon nitride thin film is formed as the third insulating layer 246.

Next, the contact hole 248 is formed in the second insulating layer 244 and the third insulating layer 246 by etching. Furthermore, the pixel electrodes 210 are formed from ITO. Here, the pixel electrodes 210 are connected to the drain electrode 228 via the contact hole 248.

Lastly, a polyimide solution is applied and baked to form the alignment film AL1 and, then, the alignment film AL1 is subjected to the alignment treatment. Thus, the TFT substrate 200 can be manufactured.

Next, a manufacturing method for the counter substrate 300 is described. Firstly, the black matrix BM is formed on the first main surface 305a of the second light-transmitting substrate 305. The black matrix BM is formed from a photosensitive resin that contains a black pigment. Next, the color filter CF and the overcoat layer OC are sequentially formed. A spacer is formed on the overcoat layer OC, and then the alignment film AL2 is formed in a manner similar to the alignment film AL1. Thus, the counter substrate 300 can be manufactured.

Next, the TFT substrate 200 and the counter substrate 300 are affixed to each other by the seal material 130 and, then, the liquid crystal LC is injected and sealed between the TFT substrate 200 and the counter substrate 300. Furthermore, the first polarizing plate 110 is provided on the TFT substrate 200, and the second polarizing plate 120 is provided on the counter substrate 300. Thus, the liquid crystal display panel 100 can be manufactured.

Furthermore, the gate driver 500, the data driver 600, the back light, and the like are mounted on the liquid crystal display panel 100. Thus, the liquid crystal display device 10 can be manufactured.

As described above, the positional relationships of the gate electrode 222, the semiconductor layer 224, the portion 226a of the source electrode 226 that overlaps the semiconductor layer 224, and the portion 228a of the drain electrode 228 that overlaps the semiconductor layer 224 in each of the pixels PX are the same and, as such, even when misalignment between the layers occurs when forming the various components of the switching elements 220, differences in the characteristics of the switching elements 220 can be reduced. Additionally, the external shapes of the pixel electrodes 210 are the same when viewed from the observer and, as such, the parasitic capacitance that is generated between the pixel electrodes 210 and the data lines DL can be made equivalent. As a result, display inconsistencies can be suppressed and the display quality of the liquid crystal display device 10 can be enhanced.

Embodiment 2

The liquid crystal display panel 100 of Embodiment 1 is a double scanning line liquid crystal display panel. A configuration is possible in which the liquid crystal display panel 100 is a triple scanning line (triple gate structure) liquid crystal display panel. In a triple scanning line liquid crystal display panel 100, the gate electrodes 222 of the switching elements 220 of a red pixel, a green pixel, and a blue pixel that form one picture element (smallest unit of display) are connected to mutually different scanning lines GL.

In the present embodiment, the connection relationships of the pixel electrodes 210, the switching elements 220, the scanning lines GL, and the like differ from the connection relationships of Embodiment 1. The other configurations of the present embodiment are the same as in Embodiment 1. Here, the connection relationships and the positional relationships between the pixel electrodes 210, the switching elements 220, the scanning lines GL, and the like are described while referencing FIGS. 6 and 7.

Figure 6:
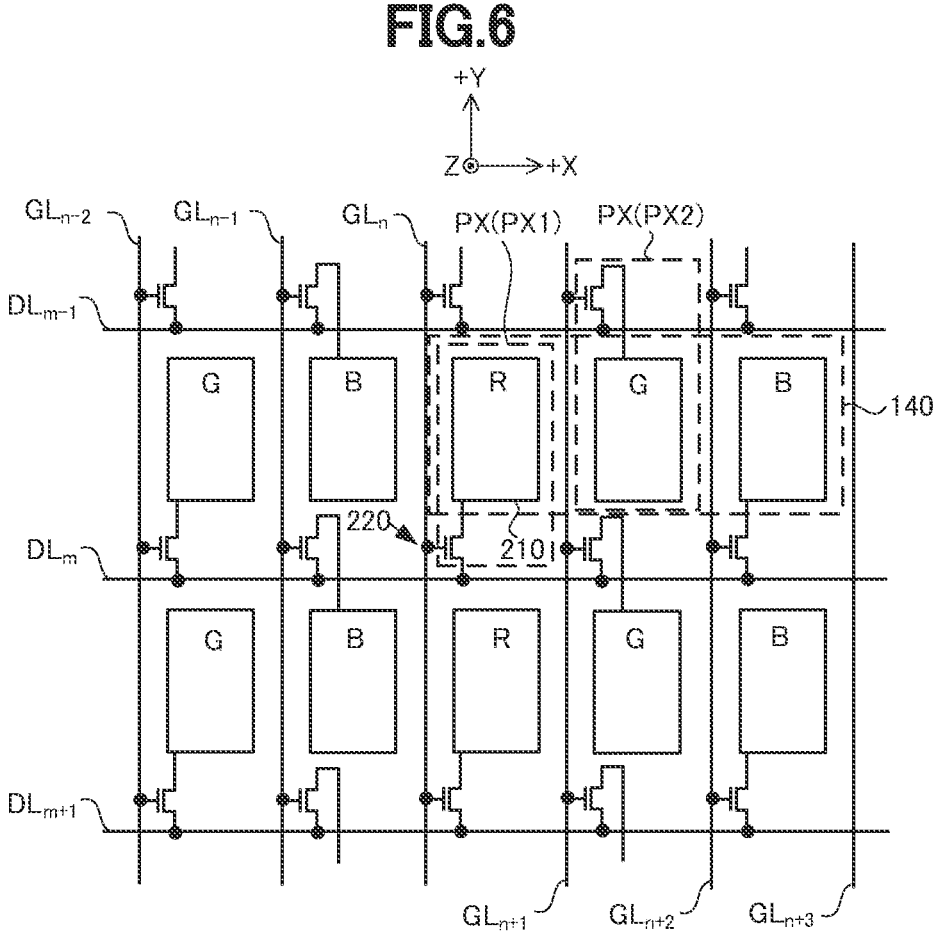
FIG. 6 is a schematic drawing illustrating connection relationships between pixel electrodes, switching elements, scanning lines, and data lines according to Embodiment 2.

In the present embodiment, as illustrated in FIG. 6, the pixel electrodes 210 of the pixels PX are arranged in a matrix in the X direction and the Y direction. The scanning lines GL extend in the Y direction and are provided one at a time between the pixel electrodes 210. The data lines DL extend in the X direction and are provided one at a time between the pixel electrodes 210.

In the present embodiment, as in Embodiment 1, the color filter CF is implemented as a color filter having a vertical stripe arrangement in which each of three colors, namely red (R), green (G), and blue (B), is arranged in one row in the Y direction. The gate electrodes 222 of the switching elements 220 of a red pixel R, a green pixel G, and a blue pixel B that form one picture element 140 are connected to mutually different scanning lines GL (for example, scanning line $GL_n$, scanning line $GL_{n+1}$, and scanning line $GL_{n+2}$). Additionally, the gate electrodes 222 of the switching elements 220 of the pixels PX of the same color arranged in the Y direction are connected to the same scanning line GL. Meanwhile, in the rows of the red pixels R, the green pixels G, and the blue pixels B arranged in the X direction, the source electrodes 226 of the switching elements 220 connected to the pixel electrodes 210 are connected in an alternating manner to the data line DL positioned on the −Y side (for example, the data line $DL_m$) or the data line DL positioned on the +Y side (for example, the data line $DL_{m-1}$).

As with the pixels PX of Embodiment 1, the pixels PX of the present embodiment, include a first pixel PX1 and a second pixel PX2 for which the relative position of the pixel electrode 210 with respect to at least one of the data line DL, to which the source electrode 226 of the switching element 220 connects, and the scanning line GL, to which the gate electrode 222 of the switching element 220 connects, differs. Specifically, as illustrated in FIG. 6, in the first pixel PX1, the pixel electrode 210 is positioned on the +X side with respect to the scanning line GL to which the gate electrode 222 connects, and is positioned on the +Y side with respect to the data line DL to which the source electrode 226 connects. Meanwhile, in the second pixel PX2, the pixel electrode 210 is positioned on the +X side with respect to the scanning line GL to which the gate electrode 222 connects, and is positioned on the −Y side with respect to the data line DL to which the source electrode 226 connects.

Figure 7:
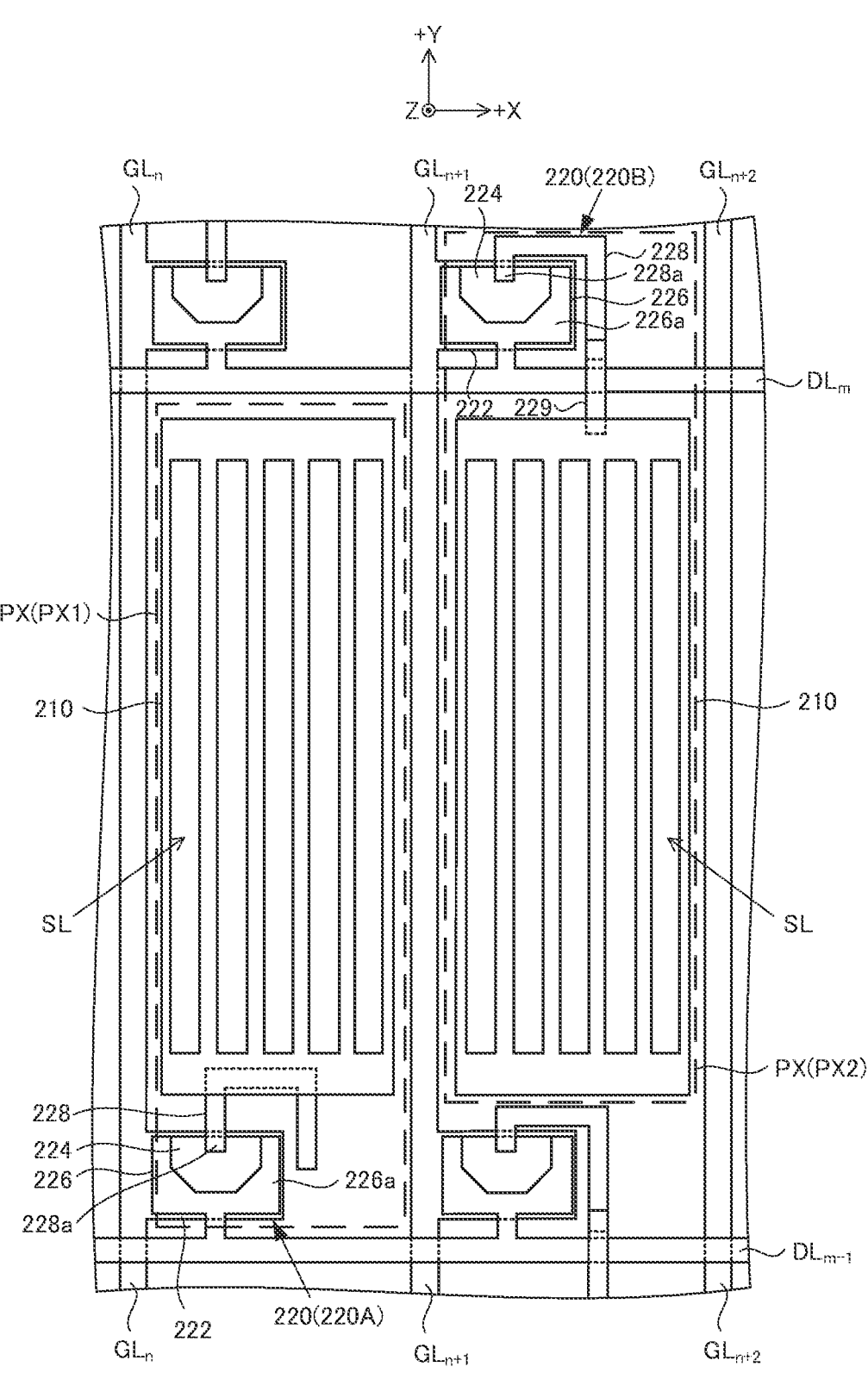
FIG. 7 is a schematic drawing illustrating positional relationships between gate electrodes, semiconductor layers, source electrodes, and drain electrodes according to Embodiment 2.

Additionally, as in Embodiment 1, in the switching element 220A of the first pixel PX1 and the switching element 220B of the second pixel PX2, the positional relationships of the gate electrode 222, the semiconductor layer 224, the portion 226a of the source electrode 226 that overlaps the semiconductor layer 224, and the portion 228a of the drain electrode 228 that overlaps the semiconductor layer 224 are formed the same. That is, as illustrated in FIG. 7, in the switching elements 220A, 220B of the present embodiment, the semiconductor layer 224 is positioned on the gate electrode 222, the portion 226a of the source electrode 226 that overlaps the semiconductor layer 224 is positioned on the −Y side, and surrounds, from the −Y side, the portion 228a of the drain electrode 228 that overlaps the semiconductor layer 224. Additionally, the portion 228a of the drain electrode 228 that overlaps the semiconductor layer 224 of the switching elements 220A, 220B of the present embodiment is positioned on the +Y side and is surrounded, from the −Y side, the portion 226a of the source electrode 226 that overlaps the semiconductor layer 224.

Accordingly, in the present embodiment as well, as in Embodiment 1, even if misalignment between the layers occurs when forming the gate electrode 222, the semiconductor layer 224, the source electrode 226, and the drain electrode 228, differences in the characteristics of the switching element 220A and the switching element 220B can be reduced, and display inconsistencies of the liquid crystal display device 10 can be suppressed.

Note that, in the present embodiment as well, as illustrated in FIG. 7, the drain electrode 228 of the switching element 220A of the first pixel PX1 is connected to the pixel electrode 210 positioned on the side (the +Y side) where the drain electrode 228 and the semiconductor layer 224 overlap, as in Embodiment 1. Additionally, the drain electrode 228 of the switching element 220B of the second pixel PX2 extends in the +Y direction and then bends to connect to the pixel electrode 210 positioned on the side (the −Y side) opposite the side where the drain electrode 228 and the semiconductor layer 224 overlap. In the second pixel PX2, the drain electrode 228 is connected to a connector 229 via a non-illustrated contact hole, and the connector 229 is connected to the pixel electrode 210.

As described above, in the present embodiment as well, the positional relationships of the gate electrode 222, the semiconductor layer 224, the portion 226a of the source electrode 226 that overlaps the semiconductor layer 224, and the portion 228a of the drain electrode 228 that overlaps the semiconductor layer 224 in each of the pixels PX are the same and, as such, even when misalignment between the layers occurs when forming the various components of the switching elements 220, differences in the characteristics of the switching elements 220 can be reduced. Additionally, as illustrated in FIG. 7, when viewed from the observer, the external shapes of the pixel electrodes 210 of the first pixel PX1 and the second pixel PX2 are the same.

Accordingly, the parasitic capacitance that is generated between the pixel electrodes 210 and the data lines DL can be made equivalent. As a result, display inconsistencies can be suppressed and the display quality of the liquid crystal display device 10 can be enhanced.

Embodiment 3

The switching element 220 of Embodiment 2 includes one gate electrode 222, but a configuration is possible in which the switching element 220 includes two gate electrodes (so-called double gate structure).

In the present embodiment, the connection relationships of the pixel electrodes 210, the switching elements 220, the scanning lines GL, and the like are different from those in Embodiments 1 and 2. Additionally, the switching element 220 has a double gate structure. The semiconductor layer 224 of the switching element 220 is formed from low-temperature polysilicon (LTPS). The other configurations of the present embodiment are the same as in Embodiment 2. The following discussion is centered on the connection relationships and the positional relationships of the pixel electrodes 210, the switching elements 220, the scanning lines GL, and the like, while referencing FIGS. 8 and 9. Note that the liquid crystal display panel 100 of the present embodiment is a triple scanning line liquid crystal display panel.

Figure 8:
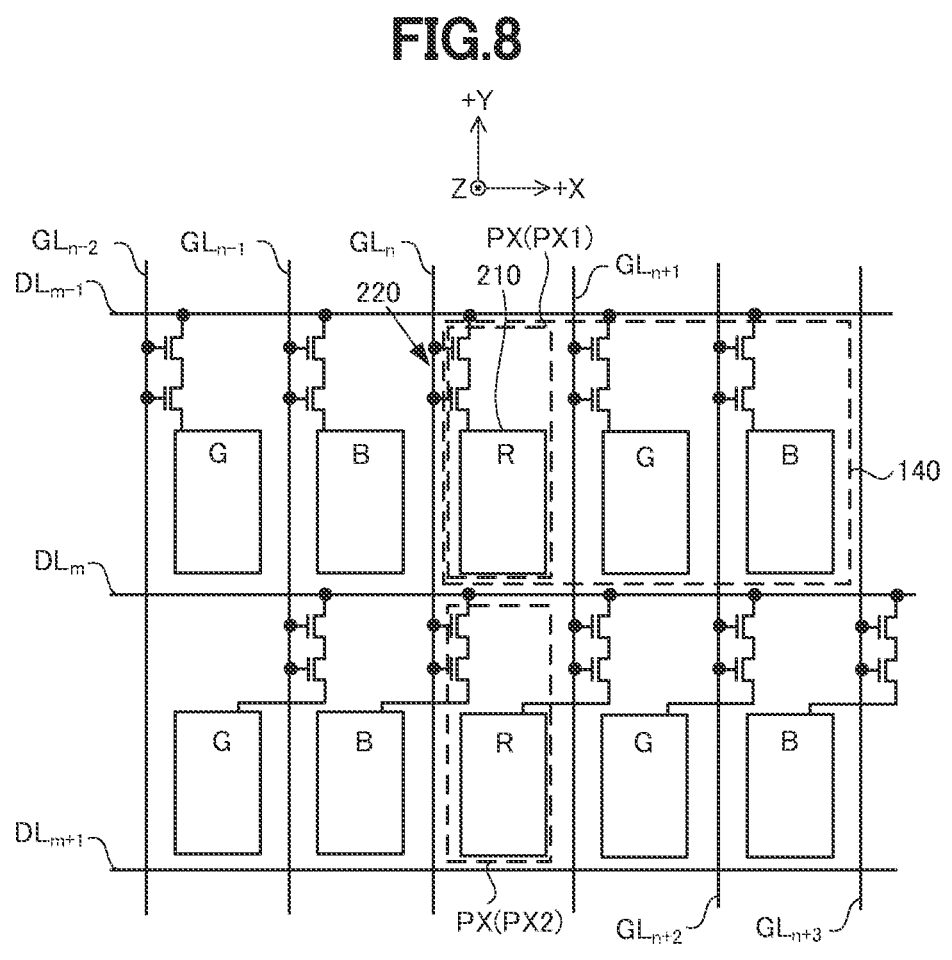

In the present embodiment, as illustrated in FIG. 8, the pixel electrodes 210 of the pixels PX are arranged in a matrix in the X direction and the Y direction. The scanning lines GL extend in the Y direction and are provided one at a time between the pixel electrodes 210. The data lines DL extend in the X direction and are provided one at a time between the pixel electrodes 210.

In the present embodiment, as in Embodiment 2, the color filter CF is implemented as a color filter having a vertical stripe arrangement in which each of three colors, namely red, green, and blue, is arranged in one row in the Y direction. The gate electrodes 222 of the switching elements 220 of a red pixel R, a green pixel G, and a blue pixel B that form one picture element 140 are connected to mutually different scanning lines GL (for example, scanning line $GL_n$, scanning line $GL_{n+1}$, and scanning line $GL_{n+2}$). Additionally, the gate electrodes 222 of the switching elements 220 of the pixels PX of the same color arranged in the Y direction are connected to the same scanning line GL. Meanwhile, in rows of the red pixels R, the green pixels G, and the blue pixels B arranged in the X direction, the source electrodes 226 of the switching elements 220 connected to the pixel electrodes 210 are connected to the same data line DL (for example, the data line $DL_m$).

As with the pixels PX of Embodiments 1 and 2, the pixels PX of the present embodiment, include a first pixel PX1 and a second pixel PX2 for which the relative position of the pixel electrode 210 with respect to at least one of the data line DL, to which the source electrode 226 of the switching element 220 connects, and the scanning line GL, to which the gate electrode 222 of the switching element 220 connects, differs. Specifically, as illustrated in FIG. 8, in the first pixel PX1, the pixel electrode 210 is positioned on the +X side with respect to the scanning line GL to which the gate electrode 222 connects, and is positioned on the −Y side with respect to the data line DL to which the source electrode 226 connects. Meanwhile, in the second pixel PX2, the pixel electrode 210 is positioned on the −X side with respect to the scanning line GL to which the gate electrode 222 connects, and is positioned on the −Y side with respect to the data line DL to which the source electrode 226 connects.

Figure 9:
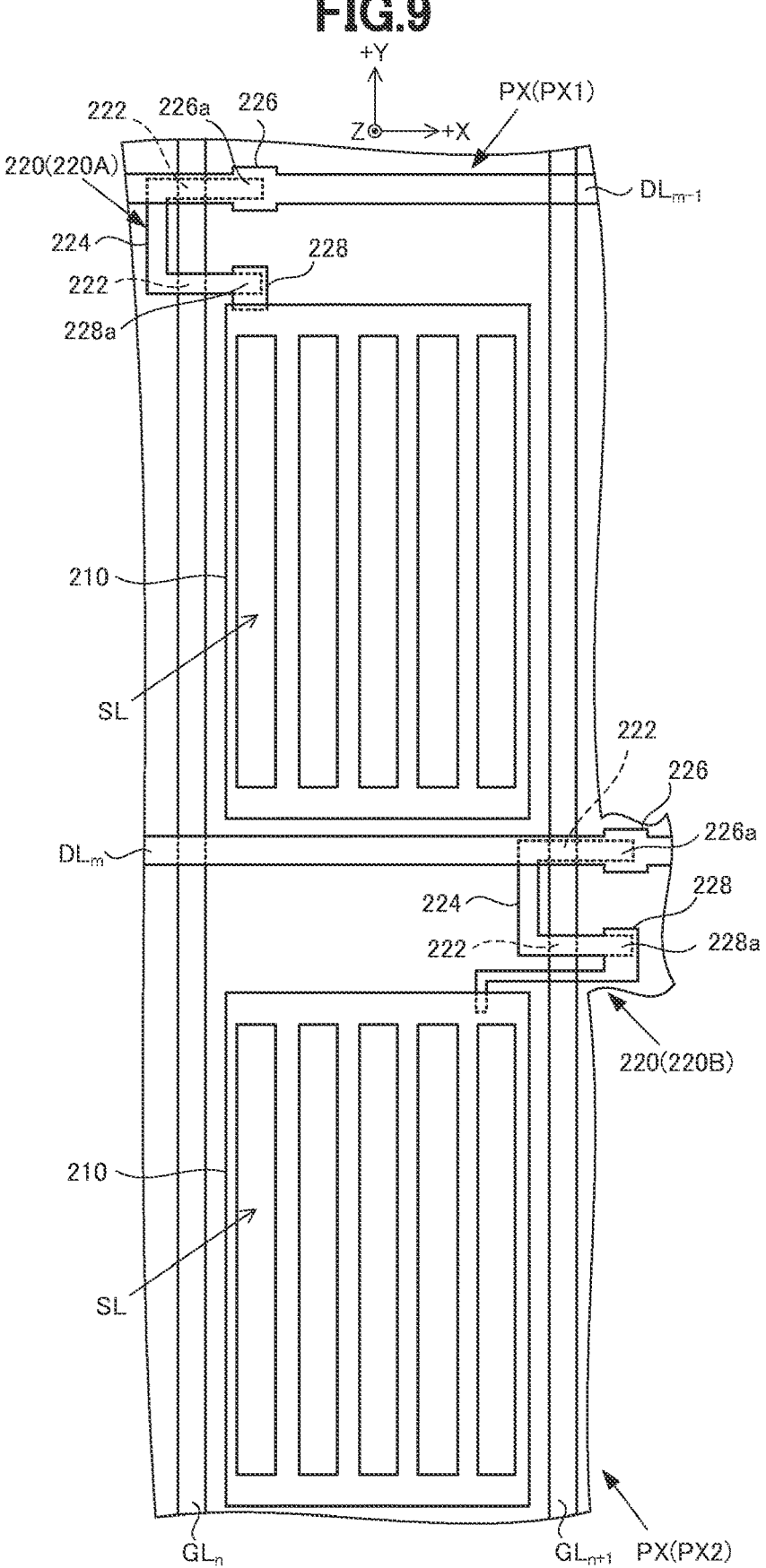
FIG. 9 is a schematic drawing illustrating positional relationships between gate electrodes, semiconductor layers, source electrodes, and drain electrodes according to Embodiment 3.

In the present embodiment, the switching element 220 has a known double gate structure. Specifically, as illustrated in FIG. 9, the bent semiconductor layer 224 formed from low-temperature polysilicon crosses the scanning line GL to form two gate electrodes (channels) 222. Additionally, the data line DL connects to and overlaps one end of the semiconductor layer 224 via a non-illustrated contact hole, and forms the source electrode 226. Furthermore, the drain electrode 228 connects to and overlaps the other end of the semiconductor layer 224 via a non-illustrated contact hole.

The drain electrode 228 of the first pixel PX1 (the switching element 220A) is connected to the pixel electrode 210 positioned on the side where the drain electrode 228 and the semiconductor layer 224 overlap. The drain electrode 228 of the second pixel PX2 (the switching element 220B) is connected to the pixel electrode 210 positioned on the side opposite the side where the drain electrode 228 and the semiconductor layer 224 overlap.

When viewed from the observer, the pixel electrode 210 of the first pixel PX1 and the pixel electrode 210 of the second pixel PX2 have the same external shape. Accordingly, in the present embodiment as well, the parasitic capacitance that is generated between the pixel electrode 210 of the first pixel PX1 and the data line DL and the parasitic capacitance that is generated between the pixel electrode 210 of the second pixel PX2 and the data line DL can be made equivalent to each other.

In the present embodiment as well, as in Embodiments 1 and 2, in the switching element 220A of the first pixel PX1 and the switching element 220B of the second pixel PX2, the positional relationships of the gate electrode 222, the semiconductor layer 224, the portion 226a of the source electrode 226 that overlaps the semiconductor layer 224, and the portion 228a of the drain electrode 228 that overlaps the semiconductor layer 224 are the same. Specifically, as illustrated in FIG. 9, in the switching elements 220A, 220B of the present embodiment, the gate electrode 222 is positioned more to the −X side than the source electrode 226 and the drain electrode 228. Additionally, the portion 226a of the source electrode 226 that overlaps the semiconductor layer 224 is positioned on one end of the semiconductor layer 224. The portion 228a of the drain electrode 228 that overlaps the semiconductor layer 224 is positioned on the one end of the semiconductor layer 224, and the portion 226a of the source electrode 226 that overlaps the semiconductor layer 224 is positioned more to the +Y side than the portion 228a of the drain electrode 228 that overlaps the semiconductor layer 224.

Accordingly, in the present embodiment as well, even if misalignment between the layers occurs when forming the gate electrode 222, the semiconductor layer 224, the source electrode 226, and the drain electrode 228, differences in the characteristics of the switching element 220A and the switching element 220B can be reduced, and display inconsistencies of the liquid crystal display device 10 can be suppressed.

As described above, in the present embodiment as well, the positional relationships of the gate electrode 222, the semiconductor layer 224, the portion 226a of the source electrode 226 that overlaps the semiconductor layer 224, and the portion 228a of the drain electrode 228 that overlaps the semiconductor layer 224 in each of the pixels PX are the same and, as such, even when misalignment between the layers occurs when forming the various components of the switching elements 220, differences in the characteristics of the switching elements 220 can be reduced. Additionally, the external shapes of the pixel electrodes 210 are the same and, as such, the parasitic capacitance that is generated between the pixel electrodes 210 and the data lines DL can be made equivalent. As a result, display inconsistencies can be suppressed and the display quality of the liquid crystal display device 10 can be enhanced.

Modified Examples

Embodiments have been described, but various modifications can be made to the present disclosure without departing from the spirit and scope of the present disclosure.

Figure 10:
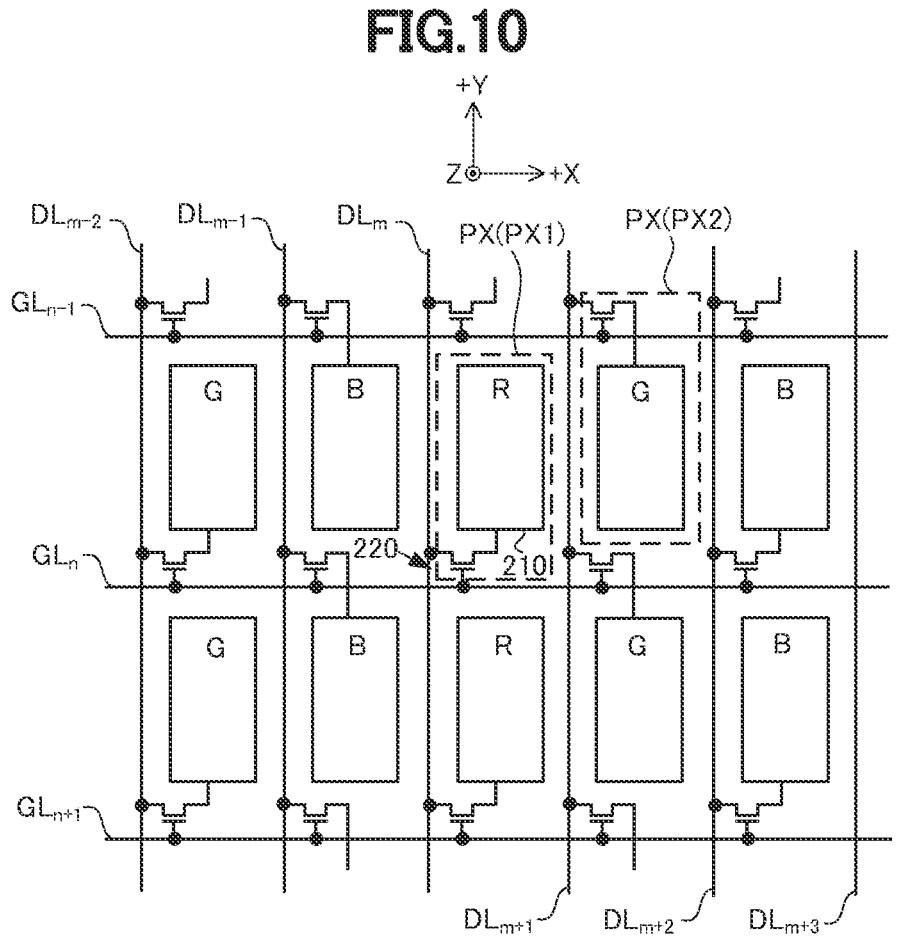
FIG. 10 is a schematic drawing illustrating connection relationships between pixel electrodes, switching elements, scanning lines, and data lines according to a modified example.
Figure 11:
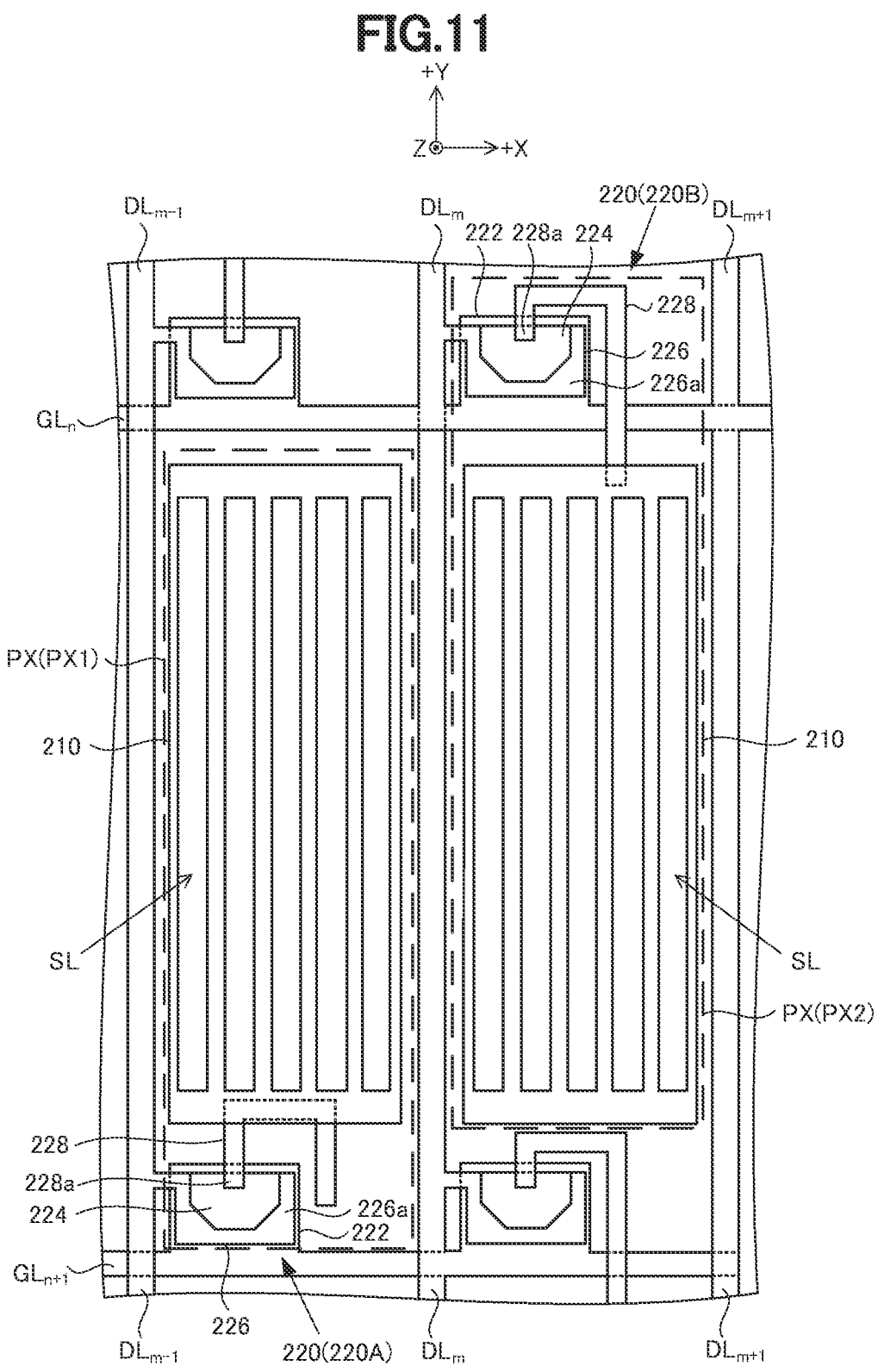
FIG. 11 is a schematic drawing illustrating positional relationships between gate electrodes, semiconductor layers, source electrodes, and drain electrodes according to a modified example.

A configuration is possible in which, for example, in the arrangement of the scanning lines GL and the data lines DL in the liquid crystal display panel 100, the scanning lines GL are disposed one at a time with respect to the pixels PX arranged in the X direction, and the data lines DL are disposed one at a time with respect to the pixels PX arranged in the Y direction. In this case as well, as illustrated in FIGS. 10 and 11, as in Embodiments 1 to 3, the liquid crystal display panel 100 includes first pixel PX1 and second pixel PX2 for which the relative position of the pixel electrode 210 with respect to at least one of the data line DL, to which the source electrode 226 of the switching element 220 connects, and the scanning line GL, to which the gate electrode 222 of the switching element 220 connects, differs. Specifically, in the first pixel PX1, the pixel electrode 210 is positioned on the +X side with respect to the data line DL to which the source electrode 226 connects, and is positioned on the +Y side with respect to the scanning line GL to which the gate electrode 222 connects. Meanwhile, in the second pixel PX2, the pixel electrode 210 is positioned on the +X side with respect to the data line DL to which the source electrode 226 connects, and is positioned on the –Y side with respect to the scanning line GL to which the gate electrode 222 connects. The drain electrode 228 of the first pixel PX1 is connected to the pixel electrode 210 positioned on the side where the drain electrode 228 and the semiconductor layer 224 overlap. The drain electrode 228 of the second pixel PX2 is connected to the pixel electrode 210 positioned on the side opposite the side where the drain electrode 228 and the semiconductor layer 224 overlap. Furthermore, when viewed from the observer, the external shapes of the pixel electrodes 210 are the same. The positional relationships of the gate electrode 222, the semiconductor layer 224, the portion 226a of the source electrode 226 that overlaps the semiconductor layer 224, and the portion 228a of the drain electrode 228 that overlaps the semiconductor layer 224 in each of the pixels PX are the same.

In the first pixel PX1 and the second pixel PX2, it is sufficient that the relative position of the pixel electrode 210 with respect to at least one of the data line DL, to which the source electrode 226 of the switching element 220 connects, and the scanning line GL, to which the gate electrode 222 of the switching element 220 connects, differ, and that the positional relationships of the semiconductor layer 224 of the switching element 220, the gate electrode 222, the portion 226a of the source electrode 226 that overlaps the semiconductor layer 224, and the portion 228a of the drain electrode 228 that overlaps the semiconductor layer 224 are the same. When the scanning lines GL extend in the X direction and the data lines DL extend in the Y direction, combinations of the configurations of the first pixel PX1 and the second pixel PX2 are the following three combinations (combinations A1 to A3).

Combination 1A

Figure 12:
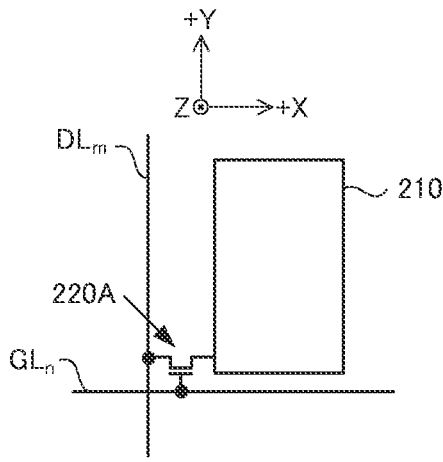
FIG. 12 is a schematic drawing illustrating connection relationships between a pixel electrode, a switching element, a scanning line, and a data line in a first pixel according to a modified example.
Figure 13:
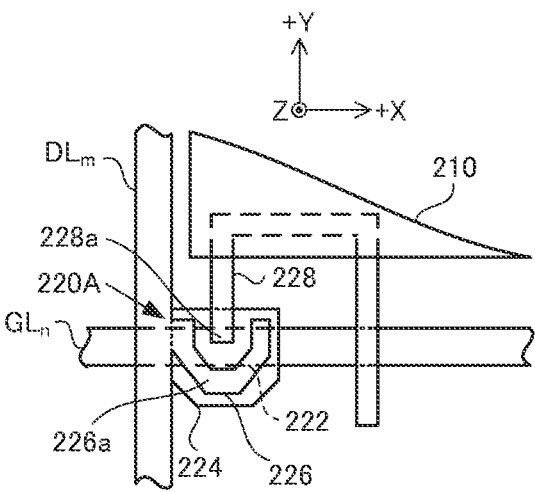
FIG. 13 is a schematic drawing illustrating the switching element of the first pixel of a modified example.

In combination A1, as illustrated in FIG. 12, the pixel electrode 210 of the first pixel PX1 is positioned on the +X side with respect to the data line DL to which the source electrode 226 connects, and is positioned on the +Y side with respect to the scanning line GL to which the gate electrode 222 connects. Furthermore, in the switching element 220A of the first pixel PX1, as illustrated in FIG. 13, the semiconductor layer 224 is positioned on the gate electrode 222. The source electrode 226 is positioned on the –Y side on the semiconductor layer 224 and surrounds the drain electrode 228 from the –Y side. The drain electrode 228 is positioned on the +Y side on the semiconductor layer 224 and extends in the +Y direction to connect to the pixel electrode 210 positioned on the side (the +Y side) where the drain electrode 228 and the semiconductor layer 224 overlap.

Figure 14:
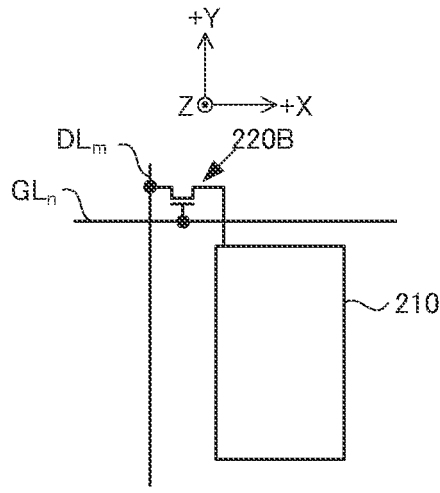
FIG. 14 is a schematic drawing illustrating connection relationships between a pixel electrode, a switching element, a scanning line, and a data line in a second pixel according to a modified example.
Figure 15:
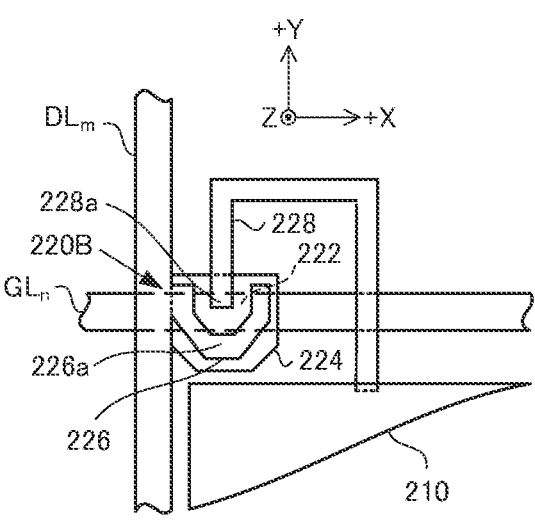
FIG. 15 is a schematic drawing illustrating the switching element of the second pixel according to a modified example.

Meanwhile, as illustrated in FIG. 14, the pixel electrode 210 of the second pixel PX2 is positioned on the +X side with respect to the data line DL to which the source electrode 226 connects, and is positioned on the –Y side with respect to the scanning line GL to which the gate electrode 222 connects. Furthermore, in the switching element 220B of the second pixel PX2, as illustrated in FIG. 15, the semiconductor layer 224 is positioned on the gate electrode 222. The source electrode 226 is positioned on the –Y side on the semiconductor layer 224 and surrounds the drain electrode 228 from the –Y side. The drain electrode 228 is positioned on the +Y side on the semiconductor layer 224, and extends in the +Y direction parallel to the data line DL to which the source electrode 226 connects and then bends to connect to the pixel electrode 210 positioned on the side (the –Y side) opposite the side where the drain electrode 228 and the semiconductor layer 224 overlap. The pixel electrode 210 is, with respect to the switching element 220B, positioned at a location straddling the scanning line GL to which the gate electrode 222 connects.

Note that a combination of a first pixel PX1 obtained by inverting, with respect to the Y axis, the first pixel PX1 illustrated in FIGS. 12 and 13, and a second pixel PX2 obtained by inverting, with respect to the Y axis, the second pixel PX2 illustrated in FIGS. 14 and 15 corresponds to the combination A1.

To describe the aforementioned configuration in other words, in the combination A1, the pixel electrode 210 of the first pixel PX1 is positioned on the right side of the target data line DL and above the target scanning line GL, and the pixel electrode 210 of the second pixel PX2 is positioned on the right side of the target data line DL and below the target scanning line GL. Additionally, in another example of the combination A1, the pixel electrode 210 of the first pixel PX1 is positioned on the left side of the target data line DL and above the target scanning line GL, and the pixel electrode 210 of the second pixel PX2 is positioned on the left side of the target data line DL and below the target scanning line GL.

Combination A2

Figure 16:
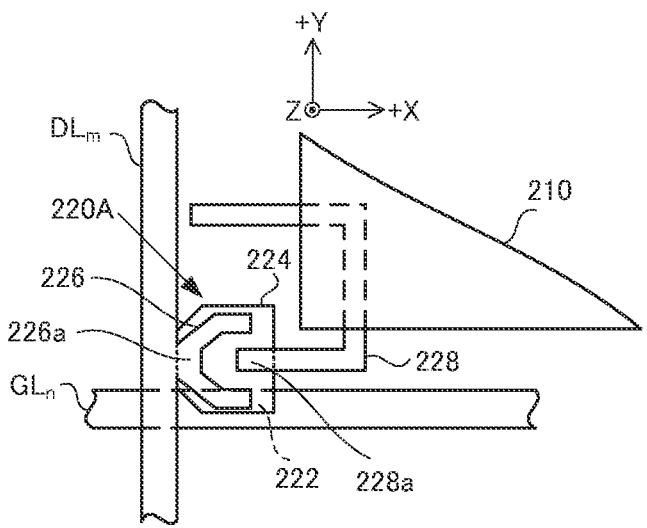
FIG. 16 is a schematic drawing illustrating the switching element of the first pixel of a modified example.

In combination A2, as with the combination A1, the pixel electrode 210 of the first pixel PX1 is positioned on the +X side with respect to the data line DL to which the source electrode 226 connects, and is positioned on the +Y side with respect to the scanning line GL to which the gate electrode 222 connects (FIG. 12). Furthermore, in the switching element 220A of the first pixel PX1, as illustrated in FIG. 16, the semiconductor layer 224 is positioned on the gate electrode 222. The source electrode 226 is positioned on the –X side on the semiconductor layer 224 and surrounds the drain electrode 228 from the –X side. The drain electrode 228 is positioned on the +X side on the semiconductor layer 224 and extends in the +X direction to connect to the pixel electrode 210 positioned on the side (the +X side) where the drain electrode 228 and the semiconductor layer 224 overlap.

Figure 17:
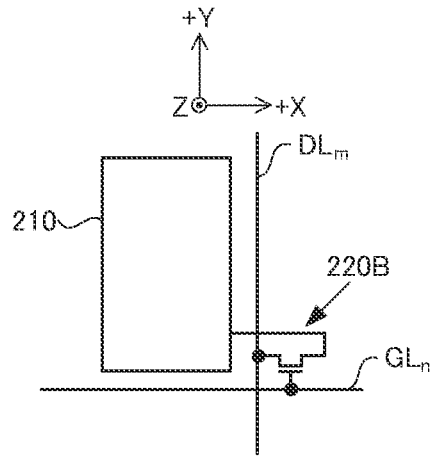
FIG. 17 is a schematic drawing illustrating connection relationships between a pixel electrode, a switching element, a scanning line, and a data line in a second pixel according to a modified example.
Figure 18:
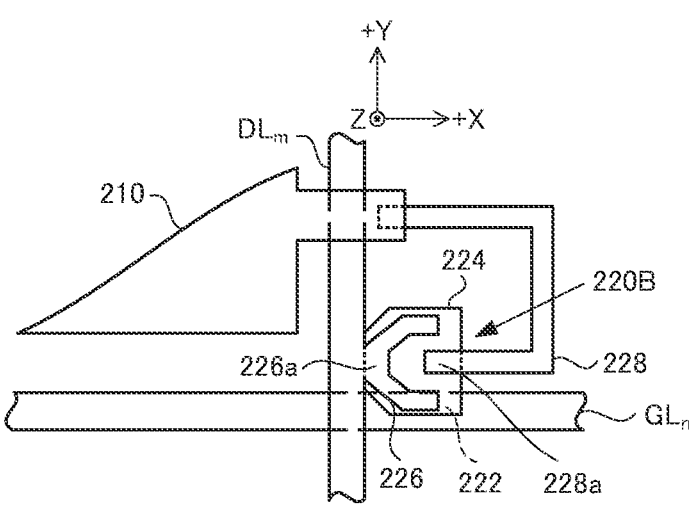
FIG. 18 is a schematic drawing illustrating the switching element of the second pixel according to a modified example.

Meanwhile, as illustrated in FIG. 17, the pixel electrode 210 of the second pixel PX2 is positioned on the –X side with respect to the data line DL to which the source electrode 226 connects, and is positioned on the +Y side with respect to the scanning line GL to which the gate electrode 222 connects. In the switching element 220B of the second pixel PX2, as illustrated in FIG. 18, the semiconductor layer 224 is positioned on the gate electrode 222. The source electrode 226 is positioned on the –X side on the semiconductor layer 224 and surrounds the drain electrode 228 from the –X side. The drain electrode 228 is positioned on the +X side on the semiconductor layer 224, extends in the +X direction parallel to the scanning line GL to which the gate electrode 222 connects and then bends to connect to the pixel electrode 210 positioned on the side (the –X side) opposite the side where the drain electrode 228 and the semiconductor layer 224 overlap. The pixel electrode 210 is, with respect to the switching element 220B, positioned at a location straddling the data line DL to which the source electrode 226 connects.

Note that a combination of a first pixel PX1 obtained by inverting, with respect to the X axis, the first pixel PX1 illustrated in FIGS. 12 and 16, and a second pixel PX2 obtained by inverting, with respect to the X axis, the second pixel PX2 illustrated in FIGS. 17 and 18 corresponds to the combination A2.

To describe the aforementioned configuration in other words, in the combination A2, the pixel electrode 210 of the first pixel PX1 is positioned on the right side of the target data line DL and above the target scanning line GL, and the pixel electrode 210 of the second pixel PX2 is positioned on the left side of the target data line DL and above the target scanning line GL. Additionally, in another example of the combination A2, the pixel electrode 210 of the first pixel PX1 is positioned on the right side of the target data line DL and below the target scanning line GL, and the pixel electrode 210 of the second pixel PX2 is positioned on the left side of the target data line DL and below the target scanning line GL.

Combination A3

In combination A3, as with the combination A1, the pixel electrode 210 of the first pixel PX1 is positioned on the +X side with respect to the data line DL to which the source electrode 226 connects, and is positioned on the +Y side with respect to the scanning line GL to which the gate electrode 222 connects (FIG. 12). Furthermore, in the switching element 220A of the first pixel PX1, as with the combination A1, the semiconductor layer 224 is positioned on the gate electrode 222. The source electrode 226 is positioned on the –Y side on the semiconductor layer 224 and surrounds the drain electrode 228 from the –Y side. The drain electrode 228 is positioned on the +Y side on the semiconductor layer 224 and extends in the +Y direction to connect to the pixel electrode 210 positioned on the side (the +Y side) where the drain electrode 228 and the semiconductor layer 224 overlap (FIG. 13).

Figure 19:
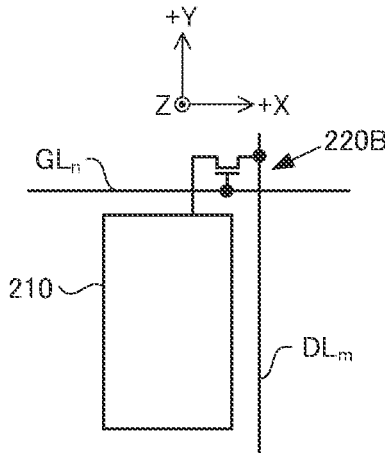
FIG. 19 is a schematic drawing illustrating connection relationships between a pixel electrode, a switching element, a scanning line, and a data line in a second pixel according to a modified example.
Figure 20:
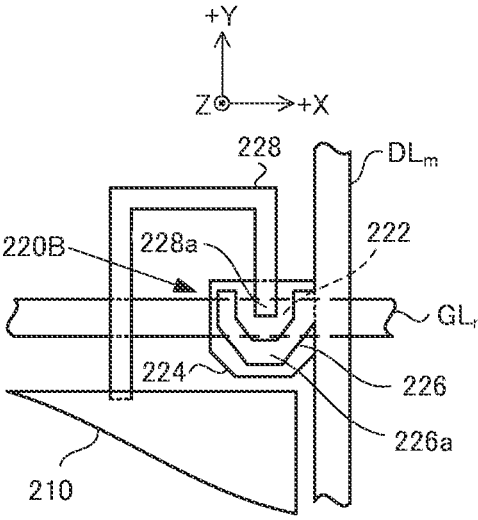
FIG. 20 is a schematic drawing illustrating the switching element of the second pixel according to a modified example.

Meanwhile, as illustrated in FIG. 19, the pixel electrode 210 of the second pixel PX2 is positioned on the –X side with respect to the data line DL to which the source electrode 226 connects, and is positioned on the –Y side with respect to the scanning line GL to which the gate electrode 222 connects. Furthermore, in the switching element 220B of the second pixel PX2, as illustrated in FIG. 20, the semiconductor layer 224 is positioned on the gate electrode 222. The source electrode 226 is positioned on the –Y side on the semiconductor layer 224 and surrounds the drain electrode 228 from the –Y side. The drain electrode 228 is positioned on the +Y side on the semiconductor layer 224, and extends in the +Y direction parallel to the data line DL to which the source electrode 226 connects and then bends to connect to the pixel electrode 210 positioned on the side (the –Y side) opposite the side where the drain electrode 228 and the semiconductor layer 224 overlap. The pixel electrode 210 is, with respect to the switching element 220B, positioned at a location straddling the scanning line GL to which the gate electrode 222 connects.

Note that a combination of a first pixel PX1 obtained by inverting, with respect to the X axis, the first pixel PX1 illustrated in FIGS. 12 and 13, and a second pixel PX2 obtained by inverting, with respect to the X axis, the second pixel PX2 illustrated in FIGS. 19 and 20 corresponds to the combination A3.

To describe the aforementioned configuration in other words, in the combination A3, the pixel electrode 210 of the first pixel PX1 is positioned on the right side of the target data line DL and above the target scanning line GL, and the pixel electrode 210 of the second pixel PX2 is positioned on the left side of the target data line DL and below the target scanning line GL. Additionally, in another example of the combination A3, the pixel electrode 210 of the first pixel PX1 is positioned on the right side of the target data line DL and below the target scanning line GL, and the pixel electrode 210 of the second pixel PX2 is positioned on the left side of the target data line DL and above the target scanning line GL.

When the scanning lines GL extend in the Y direction and the data lines DL extend in the X direction, combinations of the configurations of the first pixel PX1 and the second pixel PX2 are the following three combinations (combinations B1 to B3).

Combination B1

Figure 21:
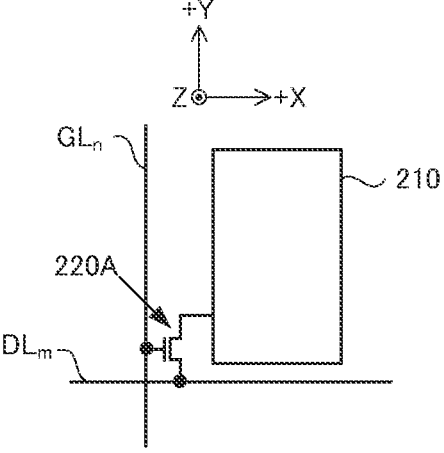
FIG. 21 is a schematic drawing illustrating connection relationships between a pixel electrode, a switching element, a scanning line, and a data line in a first pixel according to a modified example.
Figure 22:
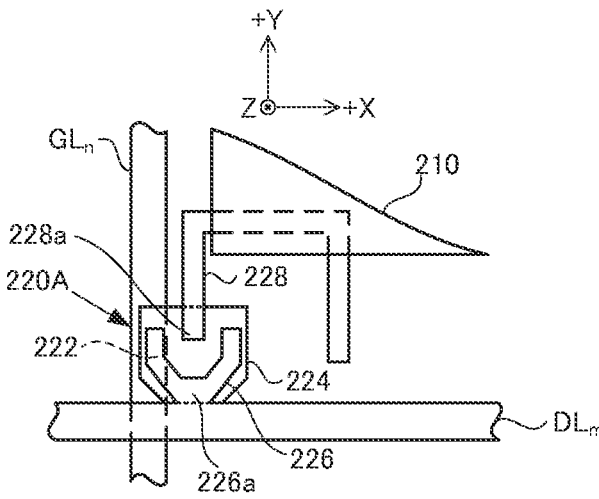
FIG. 22 is a schematic drawing illustrating the switching element of the first pixel of a modified example.

In combination B1, as illustrated in FIG. 21, the pixel electrode 210 of the first pixel PX1 is positioned on the +Y side with respect to the data line DL to which the source electrode 226 connects, and is positioned on the +X side with respect to the scanning line GL to which the gate electrode 222 connects. Furthermore, in the switching element 220A of the first pixel PX1, as illustrated in FIG. 22, the semiconductor layer 224 is positioned on the gate electrode 222. The source electrode 226 is positioned on the –Y side on the semiconductor layer 224 and surrounds the drain electrode 228 from the –Y side. The drain electrode 228 is positioned on the +Y side on the semiconductor layer 224 and extends in the +Y direction to connect to the pixel electrode 210 positioned on the side (the +Y side) where the drain electrode 228 and the semiconductor layer 224 overlap.

Figure 23:
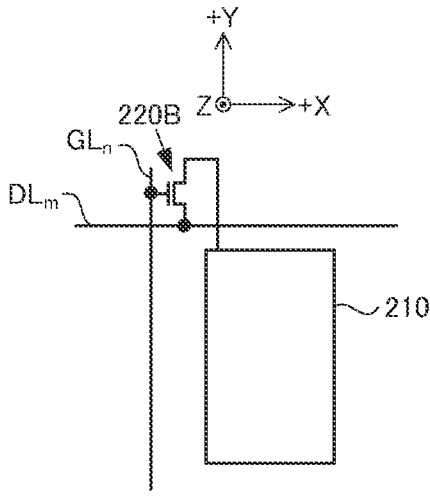
FIG. 23 is a schematic drawing illustrating connection relationships between a pixel electrode, a switching element, a scanning line, and a data line in a second pixel according to a modified example.
Figure 24:
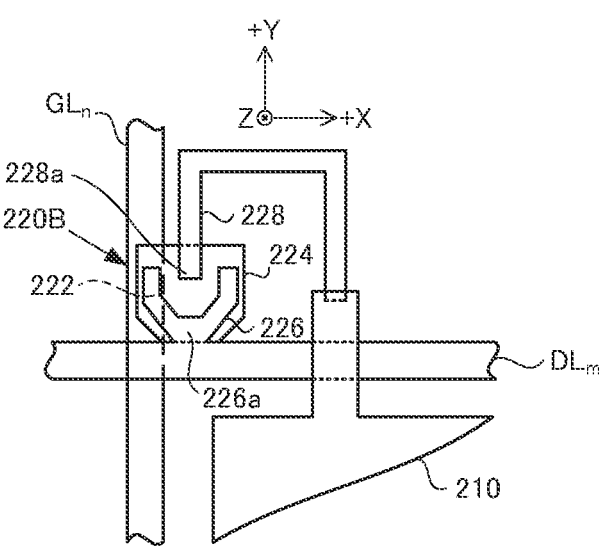
FIG. 24 is a schematic drawing illustrating the switching element of the second pixel according to a modified example.

Meanwhile, as illustrated in FIG. 23, the pixel electrode 210 of the second pixel PX2 is positioned on the –Y side with respect to the data line DL to which the source electrode 226 connects, and is positioned on the +X side with respect to the scanning line GL to which the gate electrode 222 connects. Furthermore, in the switching element 220B of the second pixel PX2, as illustrated in FIG. 24, the semiconductor layer 224 is positioned on the gate electrode 222. The source electrode 226 is positioned on the –Y side on the semiconductor layer 224 and surrounds the drain electrode 228 from the –Y side. The drain electrode 228 is positioned on the +Y side on the semiconductor layer 224, and extends in the +Y direction parallel to the scanning line GL to which the gate electrode 222 connects and then bends to connect to the pixel electrode 210 positioned on the side (the –Y side) opposite the side where the drain electrode 228 and the semiconductor layer 224 overlap. The pixel electrode 210 is, with respect to the switching element 220B, positioned at a location straddling the data line DL to which the source electrode 226 connects.

Note that a combination of a first pixel PX1 obtained by inverting, with respect to the Y axis, the first pixel PX1 illustrated in FIGS. 21 and 22, and a second pixel PX2 obtained by inverting, with respect to the Y axis, the second pixel PX2 illustrated in FIGS. 23 and 24 corresponds to the combination B1.

To describe the aforementioned configuration in other words, in the combination B1, the pixel electrode 210 of the first pixel PX1 is positioned on the right side of the target scanning line GL and above the target data line DL, and the pixel electrode 210 of the second pixel PX2 is positioned on the right side of the target scanning line GL and below the target data line DL. Additionally, in another example of the combination B1, the pixel electrode 210 of the first pixel PX1 is positioned on the left side of the target scanning line GL and above the target data line DL, and the pixel electrode 210 of the second pixel PX2 is positioned on the left side of the target scanning line GL and below the target data line DL.

Combination B2

Figure 25:
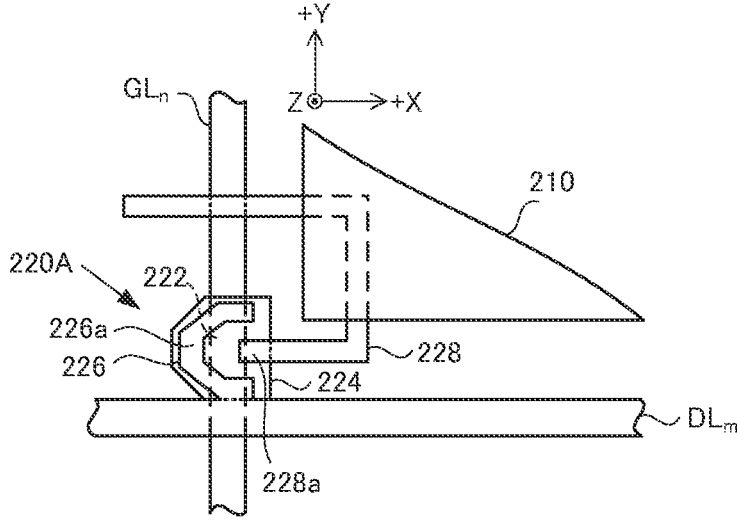
FIG. 25 is a schematic drawing illustrating the switching element of the first pixel of a modified example.

In combination B2, as with the combination B1, the pixel electrode 210 of the first pixel PX1 is positioned on the +Y side with respect to the data line DL to which the source electrode 226 connects, and is positioned on the +X side with respect to the scanning line GL to which the gate electrode 222 connects (FIG. 21). Furthermore, in the switching element 220A of the first pixel PX1, as illustrated in FIG. 25, the semiconductor layer 224 is positioned on the gate electrode 222. The source electrode 226 is positioned on the –X side on the semiconductor layer 224 and surrounds the drain electrode 228 from the –X side. The drain electrode 228 is positioned on the +X side on the semiconductor layer 224 and extends in the +X direction to connect to the pixel electrode 210 positioned on the side (the +X side) where the drain electrode 228 and the semiconductor layer 224 overlap.

Figure 26:
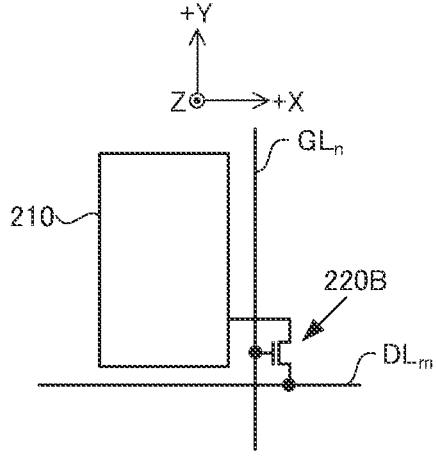
FIG. 26 is a schematic drawing illustrating connection relationships between a pixel electrode, a switching element, a scanning line, and a data line in a second pixel according to a modified example.
Figures 27, 28, 29:
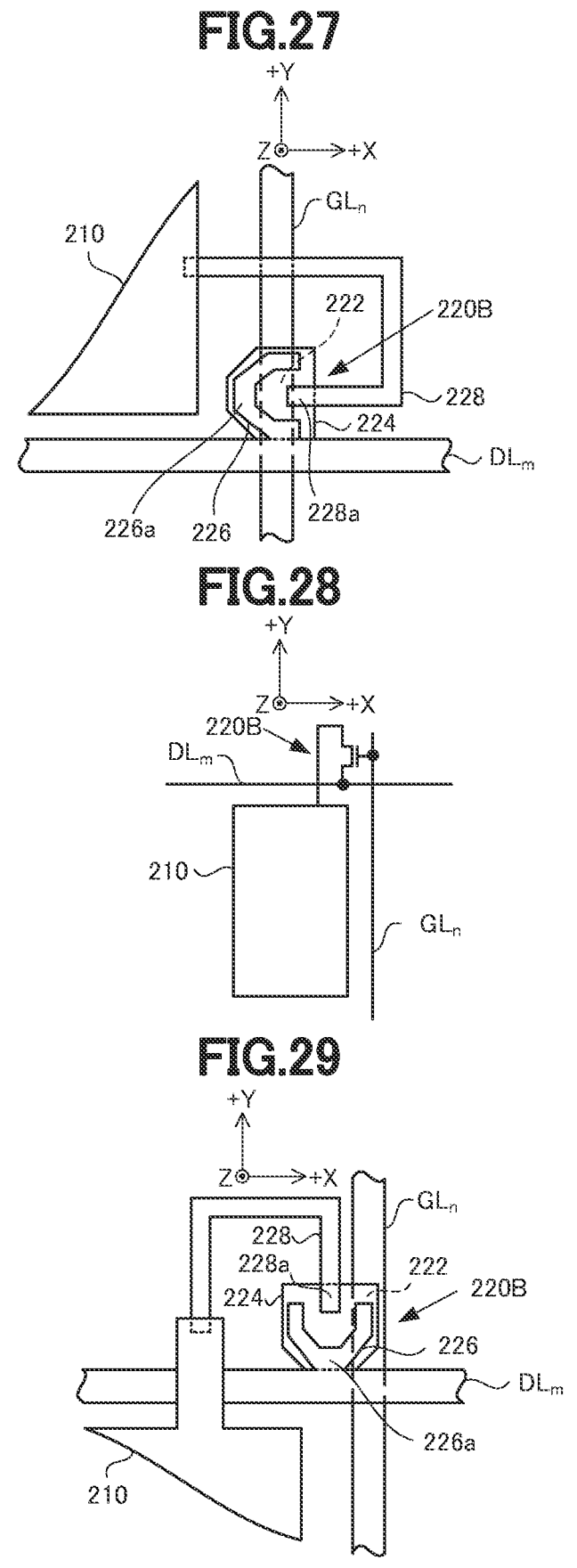

Meanwhile, as illustrated in FIG. 26, the pixel electrode 210 of the second pixel PX2 is positioned on the +Y side with respect to the data line DL to which the source electrode 226 connects, and is positioned on the –X side with respect to the scanning line GL to which the gate electrode 222 connects. Furthermore, in the switching element 220B of the second pixel PX2, as illustrated in FIG. 27, the semiconductor layer 224 is positioned on the gate electrode 222. The source electrode 226 is positioned on the –X side on the semiconductor layer 224 and surrounds the drain electrode 228 from the –X side. The drain electrode 228 is positioned on the +X side on the semiconductor layer 224, extends in the +X direction parallel to the data line DL to which the source electrode 226 connects and then bends to connect to the pixel electrode 210 positioned on the side (the –X side) opposite the side where the drain electrode 228 and the semiconductor layer 224 overlap. The pixel electrode 210 is, with respect to the switching element 220B, positioned at a location straddling the scanning line GL to which the gate electrode 222 connects.

Note that a combination of a first pixel PX1 obtained by inverting, with respect to the X axis, the first pixel PX1 illustrated in FIGS. 21 and 25, and a second pixel PX2 obtained by inverting, with respect to the X axis, the second pixel PX2 illustrated in FIGS. 26 and 27 corresponds to the combination B2.

To describe the aforementioned configuration in other words, in the combination B2, the pixel electrode 210 of the first pixel PX1 is positioned on the right side of the target scanning line GL and above the target data line DL, and the pixel electrode 210 of the second pixel PX2 is positioned on the left side of the target scanning line GL and above the target data line DL. Additionally, in another example of the combination B2, the pixel electrode 210 of the first pixel PX1 is positioned on the right side of the target scanning line GL and below the target data line DL, and the pixel electrode 210 of the second pixel PX2 is positioned on the left side of the target scanning line GL and below the target data line DL.

Combination B3

In combination B3, as with the combination B1, the pixel electrode 210 of the first pixel PX1 is positioned on the +Y side with respect to the data line DL to which the source electrode 226 connects, and is positioned on the +X side with respect to the scanning line GL to which the gate electrode 222 connects (FIG. 21). Furthermore, in the switching element 220A of the first pixel PX1, as with the combination B1, the semiconductor layer 224 is positioned on the gate electrode 222. The source electrode 226 is positioned on the –Y side on the semiconductor layer 224 and surrounds the drain electrode 228 from the –Y side. The drain electrode 228 is positioned on the +Y side on the semiconductor layer 224 and extends in the +Y direction to connect to the pixel electrode 210 positioned on the side (the +Y side) where the drain electrode 228 and the semiconductor layer 224 overlap (FIG. 22).

Meanwhile, as illustrated in FIG. 28, the pixel electrode 210 of the second pixel PX2 is positioned on the –Y side with respect to the data line DL to which the source electrode 226 connects, and is positioned on the –X side with respect to the scanning line GL to which the gate electrode 222 connects. Furthermore, in the switching element 220B of the second pixel PX2, as illustrated in FIG. 29, the semiconductor layer 224 is positioned on the gate electrode 222. The source electrode 226 is positioned on the –Y side on the semiconductor layer 224 and surrounds the drain electrode 228 from the –Y side. The drain electrode 228 is positioned on the +Y side on the semiconductor layer 224, and extends in the +Y direction parallel to the scanning line GL to which the gate electrode 222 connects and then bends to connect to the pixel electrode 210 positioned on the side (the –Y side) opposite the side where the drain electrode 228 and the semiconductor layer 224 overlap. The pixel electrode 210 is, with respect to the switching element 220B, positioned at a location straddling the data line DL to which the source electrode 226 connects.

Note that a combination of a first pixel PX1 obtained by inverting, with respect to the X axis, the first pixel PX1 illustrated in FIGS. 21 and 22, and a second pixel PX2 obtained by inverting, with respect to the X axis, the second pixel PX2 illustrated in FIGS. 28 and 29 corresponds to the combination B3.

To describe the aforementioned configuration in other words, in the combination B3, the pixel electrode 210 of the first pixel PX1 is positioned on the right side of the target scanning line GL and above the target data line DL, and the pixel electrode 210 of the second pixel PX2 is positioned on the left side of the target scanning line GL and below the target data line DL. Additionally, in another example of the combination B3, the pixel electrode 210 of the first pixel PX1 is positioned on the right side of the target scanning line GL and below the target data line DL, and the pixel electrode 210 of the second pixel PX2 is positioned on the left side of the target scanning line GL and above the target data line DL.

The combinations A1 to B3 described above can also be described as follows:

a) In the combinations A1 and B1, the pixel electrode 210 of the first pixel PX1 and the pixel electrode 210 of the second pixel PX2 have different positions relative to the wiring (the scanning lines GL in combination A1, the data lines DL in combination B1) connecting to the switching element 220 to which each of the pixel electrode 210 of the first pixel PX1 and the pixel electrode 210 of the second pixel PX2 connects and extending in a predetermined direction (the X direction, the horizontal direction of the liquid crystal display panel 100), and have identical positions relative to the wiring (the data lines DL in combination A1, the scanning lines GL in combination B1) connecting to the switching element 220 to which each of the pixel electrode 210 of the first pixel PX1 and the pixel electrode 210 of the second pixel PX2 connects and extending in a direction perpendicular (the Y direction, the vertical direction of the liquid crystal display panel 100) to the predetermined direction.

b) In the combinations A2 and B2, the pixel electrode 210 of the first pixel PX1 and the pixel electrode 210 of the second pixel PX2 have identical positions relative to the wiring (the scanning lines GL in combination A2, the data lines DL in combination B2) connecting to the switching element 220 to which each of the pixel electrode 210 of the first pixel PX1 and the pixel electrode 210 of the second pixel PX2 connects and extending in a predetermined direction (the X direction, the horizontal direction of the liquid crystal display panel 100), and have different positions relative to the wiring (the data lines DL in combination A2, the scanning lines GL in combination B2) connecting to the switching element 220 to which each of the pixel electrode 210 of the first pixel PX1 and the pixel electrode 210 of the second pixel PX2 connects and extending in a direction perpendicular (the Y direction, the vertical direction of the liquid crystal display panel 100) to the predetermined direction.

c) In the combinations A3 and B3, the pixel electrode 210 of the first pixel PX1 and the pixel electrode 210 of the second pixel PX2 have different positions relative to the wiring (the scanning lines GL in combination A3, the data lines DL in combination B3) connecting to the switching element 220 to which each of the pixel electrode 210 of the first pixel PX1 and the pixel electrode 210 of the second pixel PX2 connects and extending in a predetermined direction (the X direction, the horizontal direction of the liquid crystal display panel 100), and also have different positions relative to the wiring (the data lines DL in combination A3, the scanning lines GL in combination B3) connecting to the switching element 220 to which each of the pixel electrode 210 of the first pixel PX1 and the pixel electrode 210 of the second pixel PX2 connects and extending in a direction perpendicular (the Y direction, the vertical direction of the liquid crystal display panel 100) to the predetermined direction.

Figures 30, 31:
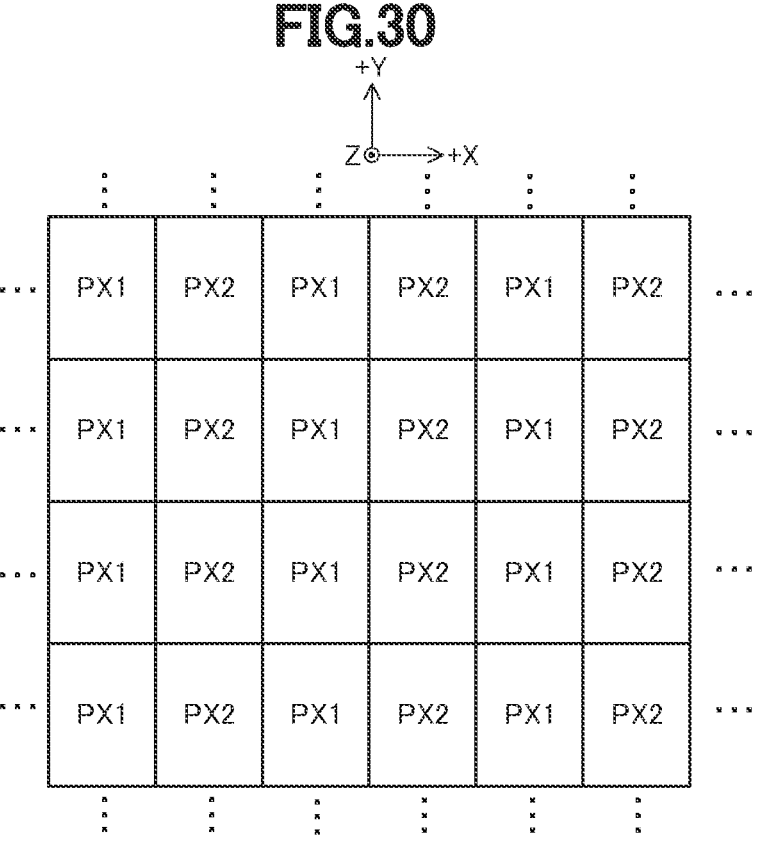
FIG. 30 is a schematic drawing illustrating the arrangement of the first pixel and the second pixel according to a modified example.
FIG. 31 is a schematic drawing illustrating the arrangement of the first pixel and the second pixel according to a modified example.

The first pixel PX1 and the second pixel PX2 are arranged in the following three manners:

1) As illustrated in FIG. 30, the first pixel PX1 and the second pixel PX2 are respectively arranged in a direction perpendicular (the Y direction) to the predetermined direction, and rows of the first pixel PX1 in the direction perpendicular to the predetermined direction and rows of the second pixel PX2 in the direction perpendicular to the predetermined direction are alternately disposed in the predetermined direction (the X direction) (hereinafter referred to as X direction alternating arrangement). In the X direction alternating arrangement, the first pixel PX1 and the second pixel PX2 are alternately arranged in the predetermined direction.

2) As illustrated in FIG. 31, the first pixel PX1 and the second pixel PX2 are respectively arranged in the predetermined direction (the X direction), and rows of the first pixel PX1 in the predetermined direction and rows of the second pixel PX2 in the predetermined direction are alternately disposed in the direction perpendicular (the Y direction) to the predetermined direction (hereinafter referred to as Y direction alternating arrangement). In the Y direction alternating arrangement, the first pixel PX1 and the second pixel PX2 are alternately arranged in the direction perpendicular to the predetermined direction.

Figure 32:
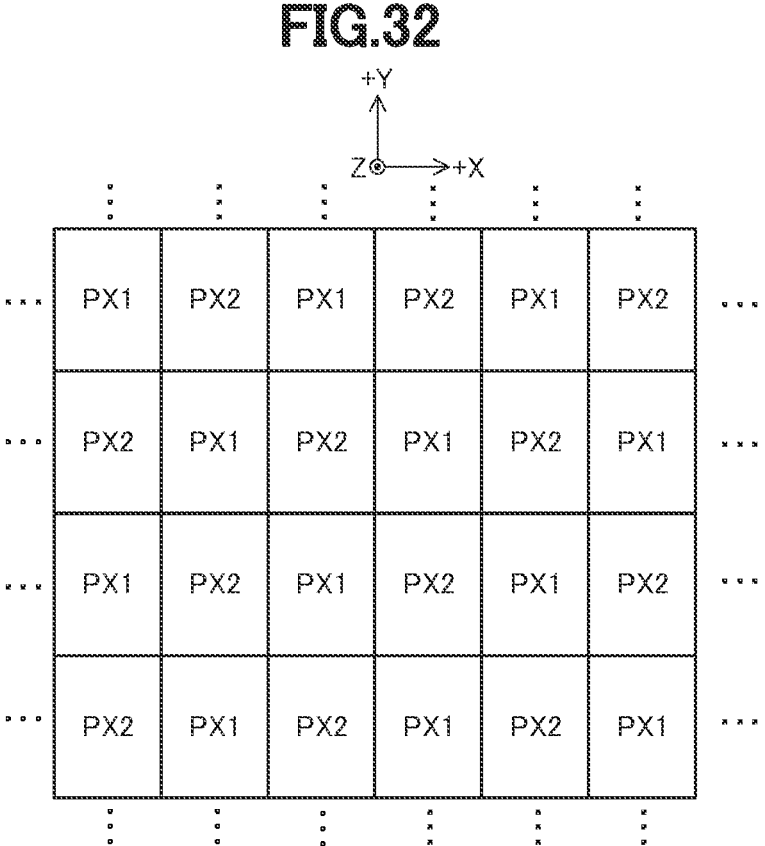
FIG. 32 is a schematic drawing illustrating the arrangement of the first pixel and the second pixel according to a modified example.

3) As illustrated in FIG. 32, the first pixel PX1 and the second pixel PX2 are alternately arranged in the predetermined direction (the X direction) and the direction perpendicular to the predetermined direction (the Y direction) (hereinafter referred to as XY direction alternating arrangement).

In the combinations A1, A2, B1, and B2 described above, the X direction alternating arrangement and the Y direction alternating arrangement can be used as the arrangement of the first pixel PX1 and the second pixel PX2. In the combinations A3 and B3 described above, any of the X direction alternating arrangement, the Y direction alternating arrangement, and the XY direction alternating arrangement can be used as the arrangement of the first pixel PX1 and the second pixel PX2.

When the combination of the configurations of the first pixel PX1 and the second pixel PX2 is set to any of the combinations A1, A2, B1, and B2, and the arrangement of the first pixel PX1 and the second pixel PX2 is set to the X direction alternating arrangement, a number of the data lines DL (the combination A1 and the combination A2) or the scanning lines GL (the combination B1 and the combination B2) that is the same as the number of the pixels PX (the first pixel PX1 and the second pixel PX2) arranged in the X direction can be disposed on the TFT substrate 200. Additionally, a number of the scanning lines GL (the combination A1 and the combination A2) or the data lines DL (the combination B1 and the combination B2) that is the same as the number of the pixels PX (the first pixel PX1 and the second pixel PX2) arranged in the Y direction can be disposed on the TFT substrate 200.

When the combination of the configurations of the first pixel PX1 and the second pixel PX2 is set to any of the combinations A3 and B3, and the arrangement of the first pixel PX1 and the second pixel PX2 is set to the X direction alternating arrangement, a number of the data lines DL (the combination A3) or the scanning lines GL (the combination B3) that is the same as the number of the pixels PX (the first pixel PX1 and the second pixel PX2) arranged in the X direction can be disposed on the TFT substrate 200. Additionally, a number of the scanning lines GL (the combination A3) or the data lines DL (the combination B3) that is the same as the number of the pixels PX (the first pixel PX1 and the second pixel PX2) arranged in the Y direction can be disposed.

Furthermore when the combination of the configurations of the first pixel PX1 and the second pixel PX2 is set to the combination A3, and the arrangement of the first pixel PX1 and the second pixel PX2 is set to the X direction alternating arrangement, a number of the data lines DL disposed on the TFT substrate 200 can be set to half the number of the pixels PX (the first pixel PX1 and the second pixel PX2) arranged in the X direction, and a number of the scanning lines GL disposed on the TFT substrate 200 can be set to two-times the number of the pixels PX (the first pixel PX1 and the second pixel PX2) arranged in the Y direction. When the combination of the configurations of the first pixel PX1 and the second pixel PX2 is set to the combination B3, and the arrangement of the first pixel PX1 and the second pixel PX2 is set to the X direction alternating arrangement, a number of the scanning lines GL disposed on the TFT substrate 200 can be set to half the number of the pixels PX (the first pixel PX1 and the second pixel PX2) arranged in the X direction, and a number of the data lines DL disposed on the TFT substrate 200 can be set to two-times the number of the pixels PX (the first pixel PX1 and the second pixel PX2) arranged in the Y direction.

When the arrangement of the first pixel PX1 and the second pixel PX2 is set to the Y direction alternating arrangement, a number of the data lines DL (the combinations A1 to A3) or the scanning lines GL (the combinations B1 to B3) that is the same as the number of the pixels PX (the first pixel PX1 and the second pixel PX2) arranged in the X direction can be disposed on the TFT substrate 200, regardless of the combination of the configurations of the first pixel PX1 and the second pixel PX2 . . . . Additionally, a number of the scanning lines GL (the combinations A1 to A3) or the data lines DL (the combinations B1 to B3) that is the same as the number of the pixels PX (the first pixel PX1 and the second pixel PX2) arranged in the Y direction can be disposed on the TFT substrate 200.

When the combination of the configurations of the first pixel PX1 and the second pixel PX2 is set to the combination A3 or the combination B3, and the arrangement of the first pixel PX1 and the second pixel PX2 is set to the XY direction alternating arrangement, a number of the data lines DL (the combination A3) or the scanning lines GL (the combination B3) that is the same as the number of the pixels PX (the first pixel PX1 and the second pixel PX2) arranged in the X direction can be disposed on the TFT substrate 200. Additionally, a number of the scanning lines GL (the combination A3) or the data lines DL (the combination B3) that is the same as the number of the pixels PX (the first pixel PX1 and the second pixel PX2) arranged in the Y direction can be disposed on the TFT substrate 200.

The combination of the configuration (the combinations A1 to B3) of the first pixel PX1 and the second pixel PX2, and the arrangement (the X direction alternating arrangement, the Y direction alternating arrangement, and the XY direction alternating arrangement) of the first pixel PX1 and the second pixel PX2 can be appropriately selected in accordance with the driver (gate driver 500, data driver 600) to be used, the driving method, and the like.

Additionally, the shapes of the various components of the switching elements 220A and 220B can be set as desired.

Figure 33:
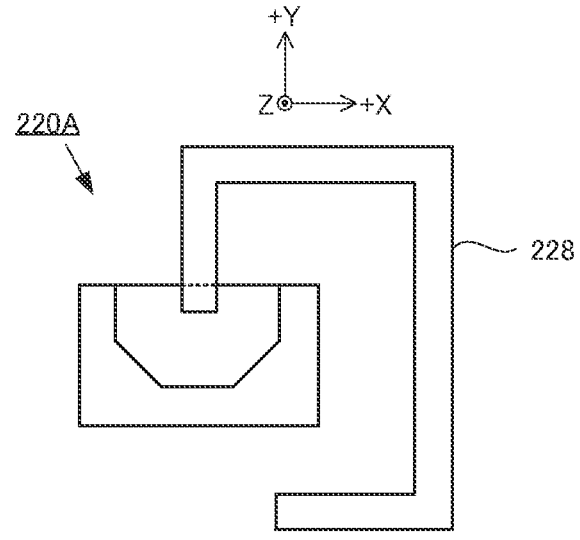
FIG. 33 is a schematic drawing illustrating a drain electrode according to a modified example.

When viewing the liquid crystal display panel 100 from above, it is preferable that the area of the drain electrode 228 of the first pixel PX1 (the switching element 220A) and the area of the drain electrode 228 of the second pixel PX2 (the switching element 220B) are equal to each other. Such a configuration makes it possible to reduce the difference between the parasitic capacitance of the first pixel PX1 and the parasitic capacitance of the second pixel PX2. For example, in Embodiment 1, as illustrated in FIG. 33, the drain electrode 228 of the first pixel PX1 (the switching element 220A) is bent similar to the drain electrode 228 of the second pixel PX2 (the switching element 220B), thereby making it possible to make the area of the drain electrode 228 of the first pixel PX1 (the switching element 220A) and the area of the drain electrode 228 of the second pixel PX2 (the switching element 220B) equal to each other.

Figure 34:
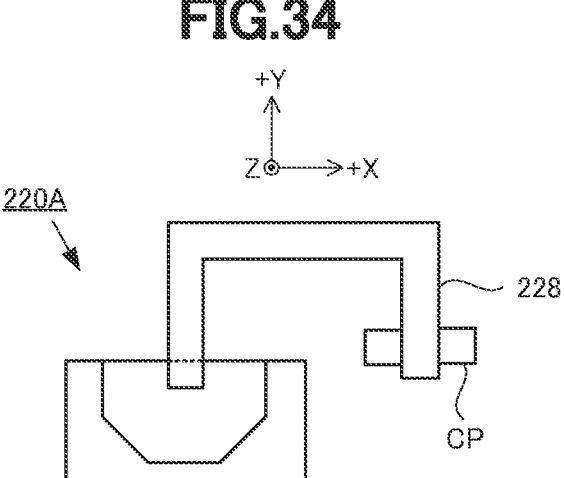
FIG. 34 is a schematic drawing illustrating a drain electrode according to a modified example.

A configuration is possible in which a capacitor Cp is provided on at least one of the drain electrode 228 of the first pixel PX1 and the drain electrode 228 of the second pixel PX2. A difference in the capacitance of the first pixel PX1 and the capacitance of the second pixel PX2 may occur due to the difference between the overlap of the pixel electrode 210 and the drain electrode 228 in the first pixel PX1 and the overlap of the pixel electrode 210 and the drain electrode 228 in the second pixel PX2. The capacitor Cp compensates for the capacitance difference between the first pixel PX1 and the second pixel PX2 that is caused by the difference in the overlapping of the pixel electrodes 210 and the drain electrodes 228. For example, a configuration is possible in which, as illustrated in FIG. 34, the capacitor Cp is provided on the drain electrode 228 of the first pixel PX1 (the switching element 220A) of Embodiment 1.

In Embodiments 1 to 3, the liquid crystal display panel 100 operates in the FFS mode, but a configuration is possible in which the liquid crystal display panel 100 operates in another transverse electric field mode, a twisted nematic (TN) mode, or the like. The shapes of the pixel electrode 210 and the common electrode CE can be set in accordance with the operation mode. Examples of the shapes include comb tooth shapes, slit-less rectangular shapes, and the like.

A configuration is possible in which the semiconductor layer 224 is formed, from an oxide that contains indium (In), gallium (Ga), and zinc (Zn), for example.

Figure 35:
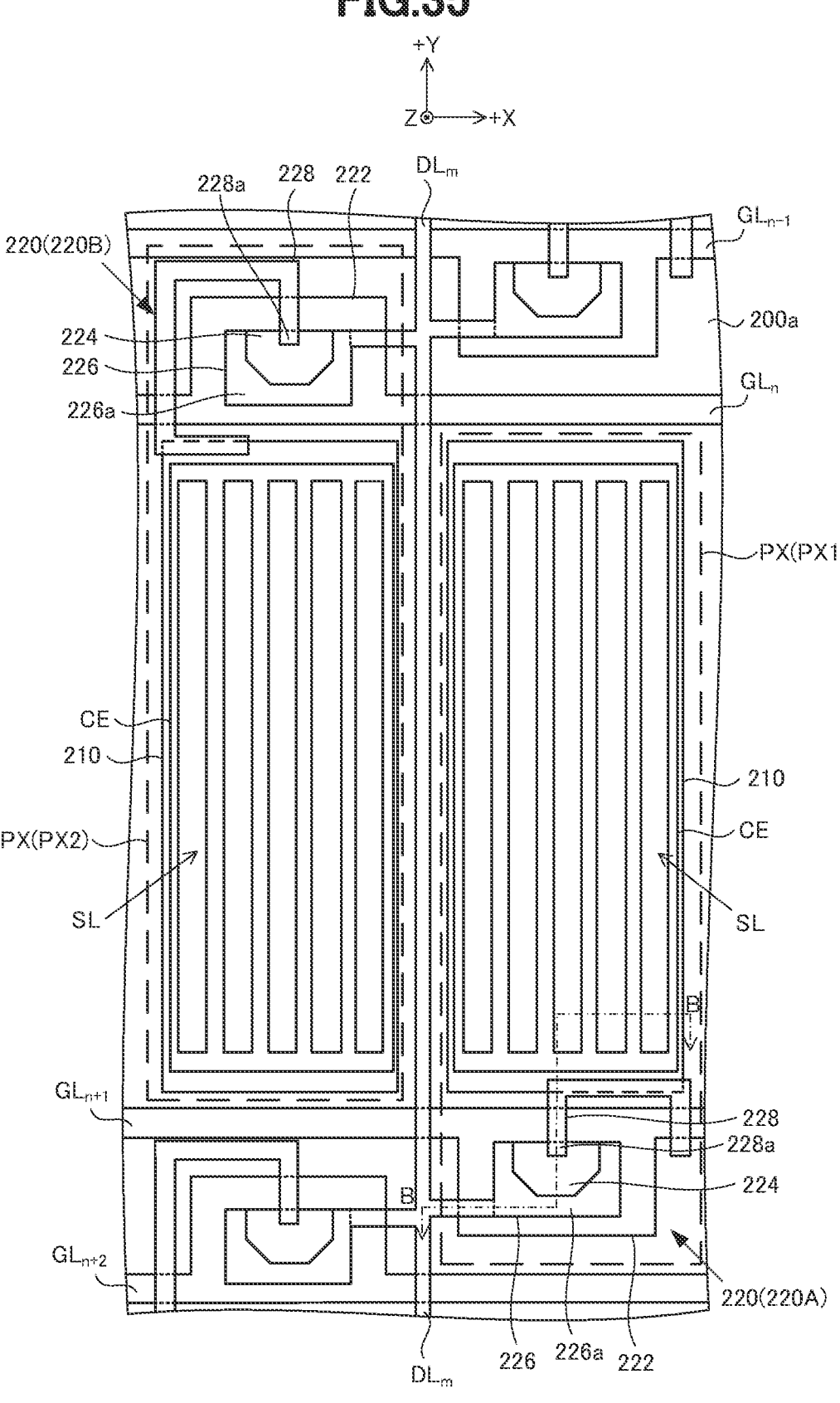
FIG. 35 is a plan view illustrating the configuration of a liquid crystal display panel according to a modified example.
Figure 36:
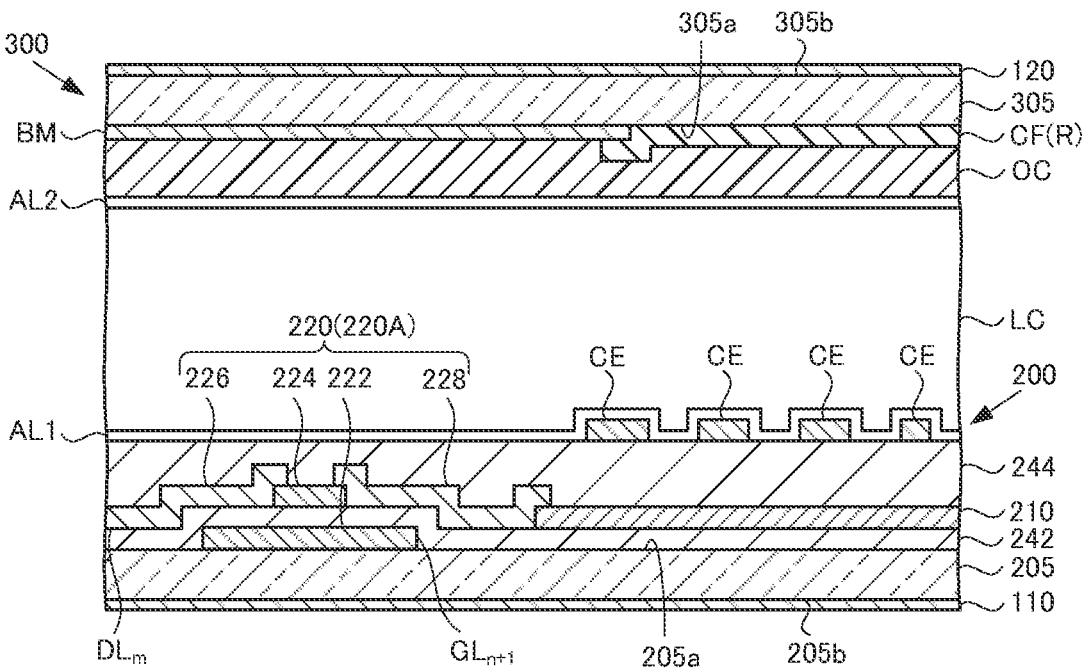
FIG. 36 is a cross-sectional view of the liquid crystal display panel illustrated in FIG. 35, taken along line B-B.

In the liquid crystal display panel 100 of Embodiments 1 to 3, the pixel electrode 210 including the slit SL is provided on the third insulating layer 246, and the common electrode CE is provided on the second insulating layer 244. A configuration is possible in which, as illustrated in FIGS. 35 and 36, in the liquid crystal display panel 100, the pixel electrode 210 having a rectangular shape is provided on the first insulating layer 242, and the common electrode CE having the slit SL is provided on the second insulating layer 244. In such a case, the drain electrode 228 of the switching elements 220 is directly connected to the pixel electrode 210.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

The invention claimed is:

1. A liquid crystal display device, comprising:
a plurality of pixels that include a switching element and a pixel electrode connected to a drain electrode of the switching element, the plurality of pixels being is-disposed in a matrix;
a plurality of scanning lines connected to a gate electrode of the switching element; and
a plurality of data lines connected to a source electrode of the switching element and crossing the scanning lines, wherein
the plurality of pixels includes a first pixel and a second pixel for which a relative position of the pixel electrode, relative to at least one of the data line to which the source electrode connects and the scanning line to which the gate electrode connects, differs,

when viewed from above, a positional relationship, in each of the plurality of pixels, of a semiconductor layer of the switching element, the gate electrode, a portion of the source electrode that overlaps the semiconductor layer, and a portion of the drain electrode that overlaps the semiconductor layer is identical, when viewed from above, an external shape of the pixel electrode in each pixel of the plurality of pixels is identical when viewed from above, the pixel electrode of the first pixel is positioned, with respect to the switching element to which the pixel electrode of the first pixel is connected, in a direction from the semiconductor layer, the gate electrode, and the portion of the source electrode that overlaps the semiconductor layer, of the switching element to which the pixel electrode of the first pixel is connected, toward the portion of the drain electrode that overlaps the semiconductor layer, of the switching element to which the pixel electrode of the first pixel is connected, and when viewed from above, the pixel electrode of the second pixel is positioned, with respect to the switching element to which the pixel electrode of the second pixel is connected, in a direction from the portion of the drain electrode that overlaps the semiconductor layer, of the switching element to which the pixel electrode of the second pixel is connected, toward the semiconductor layer, the gate electrode, and the portion of the source electrode that overlaps the semiconductor layer, of the switching element to which the pixel electrode of the second pixel is connected.

2. The liquid crystal display device according to claim 1, wherein the pixel electrode of the second pixel is positioned, with respect to the switching element to which the pixel electrode of the second pixel is connected, at a position straddling one of the data line to which the source electrode connects and the scanning line to which the gate electrode connects.

3. The liquid crystal display device according to claim 1, wherein the drain electrode of the second pixel extends parallel to one of the data line to which the source electrode connects and the scanning line to which the gate electrode connects and then bends to connect to the pixel electrode of the second pixel.

4. The liquid crystal display device according to claim 1, wherein when viewed from above, an area of the drain electrode of the first pixel and an area of the drain electrode of the second pixel are identical.

5. The liquid crystal display device according to claim 1, further comprising:

a capacitor that compensates for a capacitance difference between the first pixel and the second pixel caused by a difference in overlapping of the pixel electrode and the drain electrode in the first pixel and overlapping of the pixel electrode and the drain electrode in the second pixel, the capacitor being provided on at least one of the drain electrode of the first pixel and the drain electrode of the second pixel.

6. The liquid crystal display device according to claim 1, wherein the pixel electrode of the first pixel and the pixel electrode of the second pixel have different positions relative to one of the scanning line and the data line connecting to the switching element to which each of the pixel electrode of the first pixel and the pixel electrode of the second pixel connects and extending in a predetermined direction and, also, have identical positions relative to one of the data line and the scanning line connecting to the switching element to which each of the pixel electrode of the first pixel and the pixel electrode of the second pixel connects and extending in a direction perpendicular to the predetermined direction.

7. The liquid crystal display device according to claim 1, wherein the pixel electrode of the first pixel and the pixel electrode of the second pixel have identical positions relative to one of the scanning line and the data line connecting to the switching element to which each of the pixel electrode of the first pixel and the pixel electrode of the second pixel connects and extending in a predetermined direction and, also, have different positions relative to one of the data line and the scanning line connecting to the switching element to which each of the pixel electrode of the first pixel and the pixel electrode of the second pixel connects and extending in a direction perpendicular to the predetermined direction.

8. The liquid crystal display device according to claim 1, wherein the pixel electrode of the first pixel and the pixel electrode of the second pixel have different positions relative to one of the scanning line and the data line connecting to the switching element to which each of the pixel electrode of the first pixel and the pixel electrode of the second pixel connects and extending in a predetermined direction and, also, have different positions relative to one of the data line and the scanning line connecting to the switching element to which each of the pixel electrode of the first pixel and the pixel electrode of the second pixel connects and extending in a direction perpendicular to the predetermined direction.

9. The liquid crystal display device according to claim 6, wherein the first pixel and the second pixel are each arranged in the direction perpendicular to the predetermined direction, and a row of the first pixels arranged in the direction perpendicular to the predetermined direction and a row of the second pixel arranged in the direction perpendicular to the predetermined direction are arranged in an alternating manner in the predetermined direction.

10. The liquid crystal display device according to claim 6, wherein the first pixel and the second pixel are each arranged in the predetermined direction, and a row of the first pixels arranged in the predetermined direction and a row of the second pixel arranged in the predetermined direction are arranged in an alternating manner in the direction perpendicular to the predetermined direction.

11. The liquid crystal display device according to claim 8, wherein the first pixel and the second pixel are arranged in an alternating manner in the predetermined direction and the direction perpendicular to the predetermined direction.

* * * * *